United States Patent
Hu et al.

(10) Patent No.: US 12,537,502 B2
(45) Date of Patent: Jan. 27, 2026

(54) BULK ACOUSTIC WAVE RESONATOR AND MANUFACTURING METHOD THEREOF AND FILTER

(71) Applicant: Shenzhen Newsonic Technologies Co., Ltd., Guangdong (CN)

(72) Inventors: Weiwei Hu, Guangdong (CN); Jie Zou, Guangdong (CN); Duan Feng, Guangdong (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 19/025,829

(22) Filed: Jan. 16, 2025

(65) Prior Publication Data

US 2025/0158590 A1 May 15, 2025

(30) Foreign Application Priority Data

May 13, 2024 (CN) .......................... 202410585587.0

(51) Int. Cl.
*H03H 9/17* (2006.01)
*H03H 3/02* (2006.01)
*H03H 9/02* (2006.01)
*H03H 9/05* (2006.01)
*H03H 9/10* (2006.01)

(52) U.S. Cl.
CPC .......... *H03H 9/02133* (2013.01); *H03H 3/02* (2013.01); *H03H 9/02102* (2013.01); *H03H 9/0523* (2013.01); *H03H 9/105* (2013.01); *H03H 9/173* (2013.01); *H03H 2003/021* (2013.01)

(58) Field of Classification Search
CPC ..... H03H 9/02133; H03H 9/105; H03H 9/173
See application file for complete search history.

(56) References Cited

U.S. PATENT DOCUMENTS

| 11,677,381 | B2* | 6/2023 | Wang | ................. H03H 9/02118 |
| | | | | 333/187 |
| 2022/0103157 | A1* | 3/2022 | Wang | ..................... H03H 9/173 |
| 2022/0140810 | A1* | 5/2022 | Wang | ...................... H03H 3/02 |
| | | | | 310/349 |
| 2022/0158616 | A1* | 5/2022 | Wang | ................... H03H 9/1035 |

FOREIGN PATENT DOCUMENTS

| CN | 114900147 A | 8/2022 |
| CN | 117277986 A | 12/2023 |
| CN | 117459020 A | 1/2024 |

* cited by examiner

*Primary Examiner* — Bryan P Gordon
(74) *Attorney, Agent, or Firm* — LEASON ELLIS LLP

(57) ABSTRACT

A bulk acoustic wave resonator and manufacturing method thereof and filter, the bulk acoustic wave resonator includes: a resonant body structure, and a carrier structure and a cover structure on two opposite sides of the resonant body structure; a first cavity is between the carrier structure and the resonant body structure; the cover structure includes a cover substrate, and a cover bonding layer, a second cavity is between the cover structure and the resonant body structure; first and second conductive connectors, and a pad layer are on opposite sides of the resonant body structure, and the pad layer includes one or more bonding pads bonded with the cover bonding layer, each bonding pad has a recess recessed toward the resonant body structure, and the cover bonding layer includes a protrusion part filling the recess and surrounded by the bonding pad.

19 Claims, 12 Drawing Sheets

BULK ACOUSTIC WAVE RESONATOR AND MANUFACTURING METHOD THEREOF AND FILTER

CROSS-REFERENCE TO RELATED APPLICATION

This application claims priority to the Chinese patent application No. 202410585587.0, filed on May 13, 2024, the entire disclosure of which is incorporated herein by reference as a part of the present application.

TECHNICAL FIELD

Embodiments of the present disclosure relate to a bulk acoustic wave resonator, a manufacturing method thereof and a filter.

BACKGROUND

With the rapid development of mobile communication technology, filters based on resonators are more and more widely used in communication devices such as smart phones and the like. A film bulk acoustic wave resonator (FBAR) generally includes an upper electrode, a piezoelectric layer and a lower electrode; conductive pads and a cover structure are disposed on a side of the piezoelectric layer and the upper electrode away from the lower electrode; and the cover structure and the piezoelectric layer surround and delimit an upper cavity. For a traditional bulk acoustic wave resonator, in general, the cover structure is bonded with a resonant component such as the piezoelectric layer by using a bonding layer; and conductive bumps are disposed at a side where the cover structure is located, and are electrically connected to corresponding electrodes through the conductive pads. However, an adhesion between the bonding layer of the cover structure and part of the components bonded to the bonding layer may be poor, the bonding strength is not enough. For example, in a subsequent process, the bonding layer may undergo a deformation such as expansion or contraction, and delamination may be occurred between the bonding layer and the components bonded to the bonding layer, which may lead to reliability problems of the resonator, such as frequency deviation, bump fracture, or the like.

SUMMARY

At least one embodiment of the present disclosure provides a bulk acoustic wave resonator, including: a resonant body structure, including a piezoelectric layer, a first electrode structure layer and a second electrode layer, wherein the piezoelectric layer has a first side and a second side opposite to each other in a first direction; the first electrode structure layer is disposed on the first side of the piezoelectric layer and includes a first electrode structure; the second electrode layer is disposed on the second side of the piezoelectric layer and includes a second electrode; a carrier structure, disposed on a side of the resonant body structure away from the second electrode layer, wherein a first cavity is arranged between the carrier structure and the resonant body structure, and a portion of the first electrode structure is located in the first cavity; a cover structure, disposed on a side of the resonant body structure opposite to the carrier structure, and including a cover bonding layer and a cover substrate, wherein the cover bonding layer is disposed between the cover substrate and the resonant body structure in the first direction, a second cavity is provided between the cover structure and the resonant body structure, and a portion of the second electrode layer is located in the second cavity; a first conductive connector and a second conductive connector, disposed on a side of the resonant body structure away from the cover structure, wherein the first conductive connector extends through the carrier structure to be electrically connected with the first electrode structure, and the second conductive connector extends through the carrier structure and is electrically connected with the second electrode through an intermediate connecting component, the intermediate connecting component is spaced apart from the first cavity; and a pad layer, located on a side of the resonant body structure away from the carrier structure, and including one or more bonding pads, wherein at least a portion of each of the one or more bonding pads is bonded with the cover bonding layer, and the each of the one or more bonding pads has a recess recessed toward the first electrode structure layer, and the cover bonding layer includes a protrusion part filling the recess and surrounded by the each of the one or more bonding pads.

In the bulk acoustic wave resonator provided by at least one embodiment of the present disclosure, an orthographic projection of the recess of the each of the one or more bonding pads on a main surface of the piezoelectric layer is located within an orthographic projection of the cover bonding layer on the main surface of the piezoelectric layer.

In the bulk acoustic wave resonator provided by at least one embodiment of the present disclosure, the piezoelectric layer includes a piezoelectric via hole, and a bonding pad of the one or more bonding pads includes a horizontally extending part and a recessed part, the horizontally extending part is located at a side of the piezoelectric layer away from the first electrode structure layer, the recessed part is filled into the piezoelectric via hole, and defines the recess.

In the bulk acoustic wave resonator provided by at least one embodiment of the present disclosure, an orthographic projection of the recessed part of the bonding pad on the piezoelectric layer is offset from an orthographic projection of the second cavity on the piezoelectric layer.

In the bulk acoustic wave resonator provided by at least one embodiment of the present disclosure, the protrusion part of the cover bonding layer overlaps the piezoelectric layer in a direction parallel to a main surface of the piezoelectric layer.

In the bulk acoustic wave resonator provided by at least one embodiment of the present disclosure, the pad layer includes: a first conductive pad, disposed on a surface of the piezoelectric layer at the second side, and extending through the piezoelectric layer to be electrically connected with the first electrode structure; the first conductive pad serves as a first bonding pad among the one or more bonding pads, and the cover bonding layer includes a first protrusion part, located in the recess of the first conductive pad and surrounded by the first conductive pad.

In the bulk acoustic wave resonator provided by at least one embodiment of the present disclosure, the intermediate connecting component includes: an additional electrode structure, located in the first electrode structure layer, and spaced apart and electrically isolated from the first electrode structure; and an interconnection pad, disposed in the pad layer, located on a side of the additional electrode structure away from the carrier structure, and electrically connected with the additional electrode structure and the second electrode, and serving as a second bonding pad among the one or more bonding pads, wherein the cover bonding layer includes a second protrusion part, located in the recess of the interconnection pad, and surrounded by the interconnection pad.

In the bulk acoustic wave resonator provided by at least one embodiment of the present disclosure, the first electrode structure layer at least includes a first electrode layer, the first electrode layer includes a first electrode and an additional electrode which are spaced apart and electrically isolated from each other, the first electrode forms at least a portion of the first electrode structure, and the additional electrode forms at least a portion of the additional electrode structure.

In the bulk acoustic wave resonator provided by at least one embodiment of the present disclosure, the first electrode structure layer further includes: an edge protruding layer, located on a side of the first electrode layer away from the piezoelectric layer and/or a side of the first electrode layer close to the piezoelectric layer; wherein the edge protruding layer includes a first electrode edge protruding part and an additional electrode protruding part which are electrically isolated from each other, the first electrode edge protruding part and the first electrode are stacked in the first direction and electrically connected to each other; the additional electrode protruding part and the additional electrode are stacked in the first direction and electrically connected to each other.

In the bulk acoustic wave resonator provided by at least one embodiment of the present disclosure, further including: a passivation layer, located between the resonant body structure and the carrier structure, and located between the resonant body structure and the first cavity, and separating the first electrode structure from the first cavity.

In the bulk acoustic wave resonator provided by at least one embodiment of the present disclosure, the passivation layer includes a first passivation opening and a second passivation opening; the first conductive connector extends through the carrier structure and pass through the first passivation opening to be electrically connected with the first electrode structure; the second conductive connector extends through the carrier structure and pass through the second passivation opening to be electrically connected with the intermediate connecting component.

In the bulk acoustic wave resonator provided by at least one embodiment of the present disclosure, the carrier structure includes: a supporting dielectric layer, disposed on a side of the first electrode structure layer away from the piezoelectric layer; a cavity boundary layer, located on a side of the supporting dielectric layer and the resonant body structure away from the cover structure, and defining a portion of a boundary of the first cavity, a carrier bonding layer, located on a side of the cavity boundary layer away from the resonant body structure, and a carrier substrate, located on a side of the carrier bonding layer away from the resonant body structure.

In the bulk acoustic wave resonator provided by at least one embodiment of the present disclosure, the first conductive connector and the second conductive connector are in contact with the carrier substrate and the carrier bonding layer, and are spaced apart from the supporting dielectric layer.

In the bulk acoustic wave resonator provided by at least one embodiment of the present disclosure, the first electrode structure layer includes a gap between the first electrode structure and an additional electrode structure of the intermediate connecting component, and an orthographic projection of the gap on a main surface of the piezoelectric layer is offset from an orthographic projection of the supporting dielectric layer on the main surface of the piezoelectric layer.

In the bulk acoustic wave resonator provided by at least one embodiment of the present disclosure, a portion of the cavity boundary layer and a portion of the carrier bonding layer are located between the first conductive connector and the supporting dielectric layer and between the second conductive connector and the supporting dielectric layer in a direction parallel to a main surface of the piezoelectric layer.

In the bulk acoustic wave resonator provided by at least one embodiment of the present disclosure, the cavity boundary layer includes a first boundary layer opening and a second boundary layer opening, and the carrier bonding layer includes a first bonding layer via hole and a second bonding layer via hole, an orthographic projection of a portion of the first bonding layer via hole closest to the resonant body structure on the piezoelectric layer is located in an orthographic projection of the first boundary layer opening on the piezoelectric layer, an orthographic projection of a portion of the second bonding layer via hole closest to the resonant body structure on the piezoelectric layer is located in an orthographic projection of the second boundary layer opening on the piezoelectric layer.

In the bulk acoustic wave resonator provided by at least one embodiment of the present disclosure, the carrier bonding layer includes a first filling part filled in the first boundary layer opening and a second filling part filled in the second boundary layer opening, and a portion of the first bonding layer via hole is located in the first filling part, and a portion of the second bonding layer via hole is located in the second filling part.

In the bulk acoustic wave resonator provided by at least one embodiment of the present disclosure, a portion of the first conductive connector and a portion of the cavity boundary layer are separated by the first filling part; a portion of the second conductive connector and a portion of the cavity boundary layer are separated by the second filling part.

At least one embodiment of the present disclosure provides a filter, including any one of the above-mentioned bulk acoustic wave resonators.

At least one embodiment of the present disclosure provides a manufacturing method of a bulk acoustic wave resonator, including: forming a resonant body structure, including forming a first electrode structure layer and a second electrode layer on two opposite sides of a piezoelectric layer, wherein the piezoelectric layer includes a first side and a second side opposite to each other in a first direction; the first electrode structure layer is disposed on the first side of the piezoelectric layer, and includes a first electrode structure; the second electrode layer is disposed on the second side of the piezoelectric layer, and includes a second electrode; forming a carrier structure on a side of the resonant body structure away from the second electrode layer, and forming a first cavity between the carrier structure and the resonant body structure, wherein a portion of the first electrode structure is located in the first cavity; bonding a cover structure on a side of the resonant body structure opposite to the carrier structure, wherein the cover structure includes a cover bonding layer and a cover substrate, the cover bonding layer is arranged between the cover substrate and the resonant body structure in the first direction, and a second cavity is provided between the cover structure and the resonant body structure, and a portion of the second electrode layer is located in the second cavity; forming a first conductive connector and a second conductive connector on a side of the resonant body structure away from the cover structure, wherein the first conductive connector extends through the carrier structure to be electrically connected with the first electrode structure, and the second conductive connector extends through the carrier structure and is electrically connected with the second electrode through an intermediate connecting component, the intermediate connecting component is spaced apart from the first cavity; and before bonding the cover structure, forming a pad layer including one or more bonding pads on a side of the resonant body structure away from the carrier structure, wherein at least a portion of each of the one or more bonding pads is bonded with the cover bonding layer, and each of the one or more bonding pads includes a recess recessed toward the first electrode structure layer, and the cover bonding layer includes a protrusion part filling the recess and surrounded by the each of the one or more bonding pads.

In the manufacturing method of the bulk acoustic wave resonator provided by at least one embodiment of the present disclosure, forming the first electrode structure layer includes: forming a first electrode layer; and performing a patterning process on the first electrode layer to pattern the first electrode layer into a first electrode and an additional electrode spaced apart from each other, wherein the first electrode forms at least a portion of the first electrode structure, and the additional electrode forms at least a portion of the additional electrode structure.

In the manufacturing method of the bulk acoustic wave resonator provided by at least one embodiment of the present disclosure, forming the first electrode structure layer further includes: forming an edge protruding layer on a side of the first electrode layer close to the piezoelectric layer and/or a side of the first electrode layer away from the piezoelectric layer; and performing a patterning process on the edge protruding layer to pattern the edge protruding layer into a first electrode edge protruding part and an additional electrode protruding part spaced apart from each other, wherein the first electrode and the first electrode edge protruding part are stacked and together constitute the first electrode structure, and the additional electrode and the additional electrode protruding part are stacked and together constitute the additional electrode structure.

In the manufacturing method of the bulk acoustic wave resonator provided by at least one embodiment of the present disclosure, forming the pad layer includes forming an interconnection pad on a side of the additional electrode structure away from the carrier structure, wherein the interconnection pad is electrically connected with the second electrode and extends through the piezoelectric layer to be electrically connected with the additional electrode structure, the interconnection pad and the additional electrode structure together constitute the intermediate connecting component.

In the manufacturing method of the bulk acoustic wave resonator provided by at least one embodiment of the present disclosure, before forming the interconnection pad, the manufacturing method further includes removing a portion of the piezoelectric layer to form an additional piezoelectric via hole exposing the additional electrode structure in the piezoelectric layer; wherein the interconnection pad is filled in the additional piezoelectric via hole and is formed with the recess, and serves as a bonding pad for bonding with the cover structure.

In the manufacturing method of the bulk acoustic wave resonator provided by at least one embodiment of the present disclosure, forming the carrier structure includes: forming a dielectric material layer on a side of the resonant body structure away from the second electrode layer and patterning the dielectric material layer into a sacrificial dielectric layer and a supporting dielectric layer spaced apart from each other, and forming an opening region between the supporting dielectric layer and the sacrificial dielectric layer, wherein portions of the first electrode structure and the additional electrode structure overlap the opening region in the first direction; forming a cavity boundary layer on a side of the dielectric material layer and the resonant body structure away from the cover structure, and forming a first boundary layer opening and a second boundary layer opening in the cavity boundary layer; forming a carrier bonding layer on a side of the cavity boundary layer away from the resonant body structure, wherein the carrier bonding layer includes a first filling part filled in the first boundary layer opening and a second filling part filled in the second boundary layer opening; and bonding a carrier substrate to the carrier bonding layer.

In the manufacturing method of the bulk acoustic wave resonator provided by at least one embodiment of the present disclosure, before forming the first conductive connector and the second conductive connector, the manufacturing method further includes: performing an etching process on the carrier substrate to remove a portion of the carrier substrate and a portion of the carrier bonding layer, and forming a first carrier via hole and a second carrier via hole in the carrier substrate, wherein the portion of the carrier bonding layer being removed includes at least a portion of the first filling part and at least a portion of the second filling part, wherein the first conductive connector and the second conductive connector are respectively filled into the first carrier via hole and the second carrier via hole.

In the manufacturing method of the bulk acoustic wave resonator provided by at least one embodiment of the present disclosure, the etching process does not remove the supporting dielectric layer and the cavity boundary layer.

In the manufacturing method of the bulk acoustic wave resonator provided by at least one embodiment of the present disclosure, further including: before forming the carrier structure, forming a passivation layer on a side of the resonant body structure away from the second electrode layer to cover surfaces of the first electrode structure and the piezoelectric layer; and performing a cavity etching process after bonding the carrier substrate, so as to remove the sacrificial dielectric layer and form a first cavity, wherein during the cavity etching process, the passivation layer protects the first electrode structure from being damaged by the cavity etching process.

BRIEF DESCRIPTION OF DRAWINGS

In order to more clearly explain the technical solution of the embodiments of the present disclosure, the drawings of the embodiments will be briefly introduced below. It is obvious that the drawings in the following description only relate to some embodiments of the present disclosure, but do not intend to limit the present disclosure.

DETAILED DESCRIPTION

Figure 1:
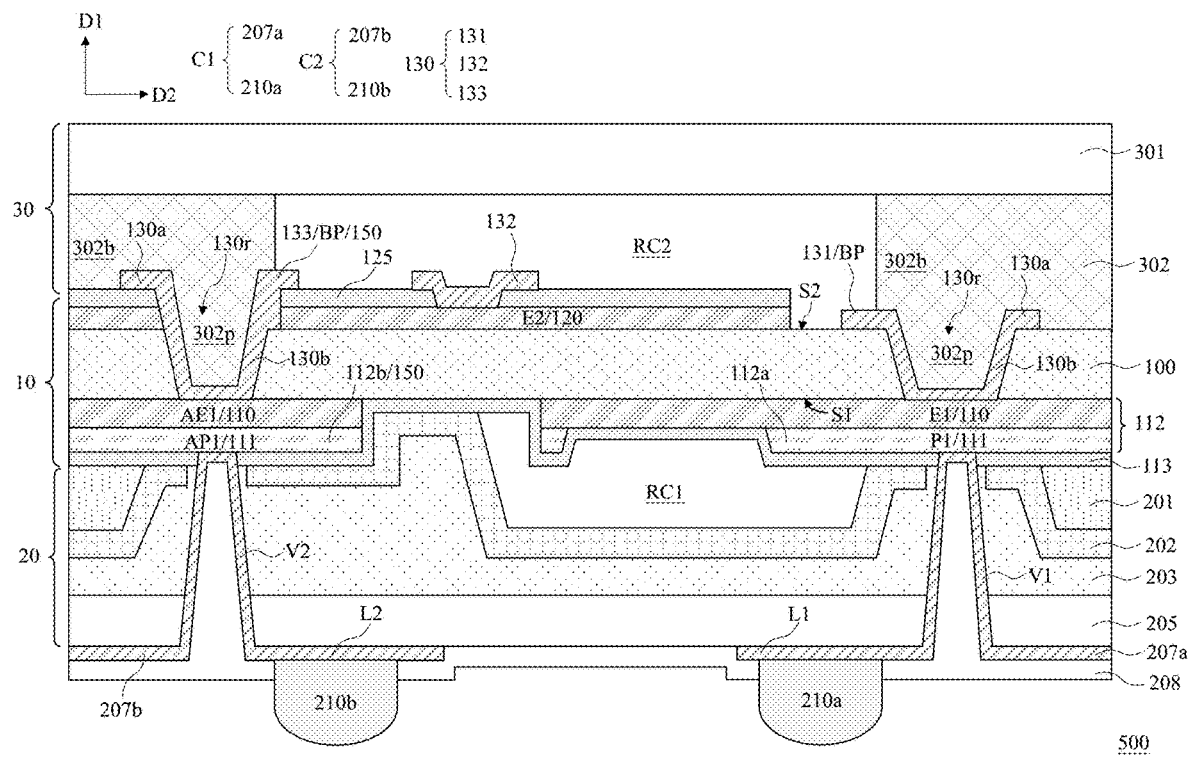
FIG. 1 illustrates a schematic cross-sectional view of a bulk acoustic wave resonator according to some embodiments of the present disclosure.

In order to make objects, technical solutions and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

Embodiments of the present disclosure provide a bulk acoustic wave resonator, a manufacturing method thereof, and a filter, the bulk acoustic wave resonator includes: a resonant body structure including a piezoelectric layer, a first electrode structure layer and a second electrode layer, wherein the piezoelectric layer has a first side and a second side opposite to each other in a first direction; the first electrode structure layer is disposed on the first side of the piezoelectric layer and includes a first electrode structure; the second electrode layer is disposed on the second side of the piezoelectric layer and includes a second electrode; a carrier structure disposed on a side of the resonant body structure away from the second electrode layer, wherein a first cavity is disposed between the carrier structure and the resonant body structure, and a portion of the first electrode structure is located in the first cavity; a cover structure, disposed on a side of the resonant body structure opposite to the carrier structure and includes a cover bonding layer and a cover substrate, wherein the cover bonding layer is disposed between the cover substrate and the resonant body structure in the first direction, a second cavity is disposed between the cover structure and the resonant body structure, and a portion of the second electrode layer is located in the second cavity; a first conductive connector and a second conductive connector, which are disposed on a side of the resonant body structure away from the cover structure, the first conductive connector extends through the carrier structure to be electrically connected with the first electrode structure, and the second conductive connector extends through the carrier structure and is electrically connected with the second electrode through an intermediate connecting component, wherein the intermediate connecting component is spaced apart from the first cavity; and a pad layer, located on a side of the resonant body structure away from the carrier structure, and the pad layer includes one or more bonding pads, wherein at least a portion of each bonding pad is bonded with the cover bonding layer, and includes a recess recessed toward the first electrode structure layer, and the cover bonding layer includes a protrusion part filling the recess, and the protrusion part is surrounded by the bonding pad.

In the bulk acoustic wave resonator and the manufacturing method thereof provided by the embodiments of the present disclosure, at least the following technical effects are achieved: by disposing the first conductive connector and the second conductive connector on the side of the resonant body structure away from the cover structure, and disposing the intermediate connecting component to realize the electrical connection between the second conductive connector and the second electrode located on the second side of the piezoelectric layer, adverse effects on the conductive connectors due to possible problems such as deformation and delamination of the cover bonding layer can be minimized, effective electrical connection between the conductive connectors and the electrodes can be ensured, and the reliability of the device can be improved. In addition, on the basis of the above arrangement of the conductive connectors, the embodiment of the present disclosure further provides the bonding pad with the recess in the pad layer, and the cover bonding layer fills the recess of the bonding pad and is surrounded by the bonding pad, so that a bonding area between the cover bonding layer and the resonant body structure can be increased, moreover, the protrusion part of the cover bonding layer is located in the recess and surrounded by the bonding pad, thereby avoiding or reducing the possibility of delamination between the cover bonding layer and the bonding pad, and improving the bonding strength between the cover bonding layer and the resonant body structure, thus further improving the performance of the device.

For example, in some traditional bulk acoustic wave resonators, conductive connectors and a cover structure are disposed on a same side of the piezoelectric layer, and the conductive connectors are electrically connected to conductive pads through via holes located in a cover bonding layer and a cover substrate, and further electrically connected to corresponding electrodes through the conductive pads; moreover, the cover structure usually covers a horizontally extending part of the conductive pad to facilitate the connection between the conductive connector embedded in the cover bonding layer and the conductive pad. In these bulk acoustic wave resonators, a portion of the conductive connector is embedded in the cover bonding layer. If the cover bonding layer undergoes deformation such as expansion or contraction, and problems such as delamination occur between the cover bonding layer and the conductive pad, it may further adversely affects the conductive connector embedded in the cover bonding layer, and problems such as frequency offset, fracture of the conductive connector and so on may be occurred, and the electrical connection between the conductive connector and the conductive pad may be affected, thus reducing the reliability of the device.

Compared with the traditional bulk acoustic wave resonator, the conductive connectors and the cover structure of the bulk acoustic wave resonator in the embodiment of the present disclosure are disposed at different sides of the piezoelectric layer, so that the conductive connectors do not directly contact with the cover bonding layer, and therefore, even if the cover bonding layer is deformed or delaminated, the conductive connectors are not adversely affected substantially, and the electrical connection between the conductive connectors and the corresponding electrodes can be effectively maintained, and the reliability of the device can be improved. In addition, because the conductive connectors of the embodiment of the present disclosure are not disposed at the side where the cover structure is located, the cover bonding layer can be set without considering the connection between the conductive connectors and the conductive pads, so the cover bonding layer can be not only disposed on a horizontally extending part of the conductive pad (bonding pad), but also filled into the recess of the conductive pad, thereby further increasing the bonding strength between the cover structure and the resonant body structure, and further improving the reliability and device performance of the resonator.

FIG. 1 illustrates a schematic cross-sectional view of a bulk acoustic wave resonator according to some embodiments of the present disclosure.

Referring to FIG. 1, in some embodiments, a bulk acoustic wave resonator 500 includes a resonant body structure 10, a carrier structure 20, a cover structure 30, a first conductive connector C1 and a second conductive connector C2. The resonant body structure 10 includes a piezoelectric layer 100, a first electrode structure layer 112 and a second electrode layer 120, the piezoelectric layer 100 has a first side S1 and a second side S2 opposite to each other in a first direction D1; the first electrode structure layer 112 is disposed on the first side S1 of the piezoelectric layer 100 and includes a first electrode structure 112a. The second electrode layer 120 is disposed on the second side S2 of the piezoelectric layer 100 and includes a second electrode E2.

The carrier structure 20 is disposed on a side of the resonant body structure 10 close to the first electrode structure layer 112 (i.e., away from the second electrode layer 120), a first cavity RC1 is disposed between the carrier structure 20 and the resonant body structure 10, a portion of the first electrode structure 112a is located in the first cavity RC1.

The cover structure 30 is disposed on a side of the resonant body structure 10 opposite to the carrier structure 20, and includes a cover substrate 301 and a cover bonding layer 302, the cover bonding layer 302 is disposed between the cover substrate 301 and the resonant body structure 10 in the first direction D1, and a second cavity RC2 is disposed between the cover structure 30 and the resonant body structure 10, and a portion of the second electrode layer 120 is located in the second cavity RC2. In some embodiments, the piezoelectric layer 100, the first electrode structure 112a, the second electrode E2, the first cavity RC1, and the second cavity RC2 at least partially overlap with each other in a direction perpendicular to a main surface of the piezoelectric layer 100 (e.g., the first direction D1).

The first conductive connector C1 and the second conductive connector C2 are disposed on a side of the resonant body structure 10 away from the cover structure 30, the first conductive connector C1 extends through the carrier structure 20 to be electrically connected with the first electrode structure 112a, and the second conductive connector C2 extends through the carrier structure 20 and is electrically connected with the second electrode E2 through an intermediate connecting component 150, the intermediate connecting component 150 is spaced apart from the first cavity RC1.

The bulk acoustic wave resonator 500 further includes a pad layer 130, which is disposed on a side of the resonant body structure 10 away from the carrier structure 20 and includes one or more bonding pads BP, each bonding pad BP has at least a portion bonded with the cover bonding layer 302, and includes a recess 130r recessed toward the first electrode structure layer 112, and the cover bonding layer 302 includes a protrusion part 302p filling the recess 130r, and the protrusion part 302p is surrounded by the bonding pad BP (for example, in a direction parallel to a main surface of the piezoelectric layer 100).

In some embodiments, an orthographic projection of the recess 130r of the bonding pad BP on the main surface of the piezoelectric layer 100 is located within an orthographic projection of the cover bonding layer 302 on the main surface of the piezoelectric layer 100. For example, the piezoelectric layer 100 includes a piezoelectric via hole, and the bonding pad BP includes a horizontally extending part 130a and a recessed part 130b, the horizontally extending part 130a is located at a side of the piezoelectric layer 100 away from the first electrode structure layer 112, at least a portion of the recessed part 130b is located in the piezoelectric via hole of the piezoelectric layer 100, and the recessed part 130b defines the recess 130r.

For example, the recessed part 130b of the bonding pad BP includes a first surface and a second surface opposite to each other in the direction perpendicular to the main surface of the piezoelectric layer 100 (for example, the first direction D1), and the second surface is in contact with the first electrode structure layer 112; the recessed part 130b includes a first sidewall (or called an inner sidewall) and a second sidewall (or called an outer sidewall) that are opposite to each other in a direction parallel to the main surface of the piezoelectric layer (for example, a horizontal direction including a second direction D2), and the second sidewall is in contact with the piezoelectric layer 100.

For example, the recess 130r of the bonding pad BP is defined by the first surface and the first sidewall of the recessed part 130b; the cover bonding layer 302 may cover and contact a portion of a surface of the horizontally extending part of the bonding pad BP, and be filled into the recess 130r to cover and contact the first surface and the first sidewall of the recessed part of the bonding pad. In some embodiments, the first surface and the first sidewall of the bonding pad BP are completely covered by the cover bonding layer 302. A contact area between the cover bonding layer 302 and the bonding pad BP may be greater than or equal to a sum of an area of the first surface and a surface area of the first sidewall of the recessed part 130b of the bonding pad BP.

In some embodiments, the cover bonding layer 302 and the cover substrate 301 of the cover structure 30 and the resonant body structure 10 enclose to form the second cavity RC2, and a sidewall of the cover bonding layer 302 and a surface of the cover substrate 301 facing the resonant body structure 10 define a portion of a boundary of the second cavity RC2.

In some embodiments, because the recessed part 130b of the bonding pad BP is completely covered by the cover bonding layer 302, the recessed part 130b may not be exposed in the second cavity RC2. For example, an orthographic projection of the recessed part 130b on the main surface of the piezoelectric layer 100 is offset from an orthographic projection of the second cavity RC2 on the main surface of the piezoelectric layer 100. In present disclosure, orthographic projections of multiple components on a certain reference plane being offset from each other indicate that the orthographic projections of the multiple components do not overlap, including the case that orthographic projections of the multiple components are spaced apart from, without overlapping, each other, and also including the case that orthographic projections of the multiple components border, but do not overlap, each other.

In some embodiments, a portion of the horizontally extending part 130a of the bonding pad BP may also be exposed by the cover bonding layer 302, that is, not covered by the cover bonding layer 302; the portion of the horizontally extending part 130a may also be referred to as an exposed portion. For example, the exposed portion of the horizontally extending part 130a may be exposed in the second cavity RC2, but the present disclosure is not limited thereto.

In some embodiments, the cover bonding layer 302 includes a body part 302b and the protrusion part 302p, and the body part 302b is located between the cover substrate 301 and the protrusion part 302p, and may be in contact with the cover substrate 301, for example. The protrusion part 302p protrudes, away from the cover substrate 301 and toward the carrier structure 20 in the first direction D1, from the surface of the body part 302b at the side away from the cover substrate 301.

For example, the body part 302b of the cover bonding layer 302 is located on a side of the piezoelectric layer 100 away from the first electrode structure layer 112 in the direction perpendicular to the main surface of the piezoelectric layer (e.g., the first direction D1), and the protrusion part 302p may overlap the piezoelectric layer 100 in the direction parallel to the main surface of the piezoelectric layer 100 (e.g., the horizontal direction including the second direction D2). In the present disclosure, multiple components being overlapped in a direction refers to that the orthographic projections of the multiple components on a reference plane perpendicular to the direction are overlapped with each other. That is to say, an orthographic projection of the protrusion part 302p of the cover bonding layer 302 on a reference plane perpendicular to the main surface of the piezoelectric layer 100 (for example, an extended surface of a sidewall of the piezoelectric layer 100, the carrier structure or the cover structure, etc.) may overlap with an orthographic projection of the piezoelectric layer 100 on the reference plane. In present disclosure, the first direction D1 and the second direction D2 intersect each other, for example, are perpendicular to each other; for example, in the illustrated example, the first direction D1 is a vertical direction, and the second direction D2 is a horizontal direction.

Still referring to FIG. 1, in some embodiments, the pad layer 130 includes one or more conductive pads, and one or more of the one or more conductive pads may serve as the bonding pad BP. The one or more conductive pads include a conductive material such as metal, for example, gold (Au). For example, the one or more conductive pads may include an interconnection pad 133 electrically connected with the second electrode E2 and extending through the piezoelectric layer 100 to electrically connect with an additional electrode structure 112b of the first electrode structure layer 112.

For example, the interconnection pad 133 may include a first part located in a via hole of the piezoelectric layer 100 and a second part in contact with the second electrode E2, the first part is electrically connected with the additional electrode structure 112b, and the second part at least covers and contacts a sidewall of the second electrode E2 and is connected with the first part, so that the second electrode E2 can be electrically connected with the additional electrode structure 112b through the interconnection pad 133.

For example, the second electrode E2 may include an electrode via hole, and the piezoelectric layer 100 may include an additional piezoelectric via hole, and the electrode via hole and the additional piezoelectric via hole are in spatial communication with each other, so as to expose a portion of a surface of the additional electrode structure 112b close to the piezoelectric layer. The interconnection pad 133 is in contact with and electrically connected with the second electrode E2, and is electrically connected with the additional electrode structure 112b through the electrode via hole in the second electrode E2 and the additional piezoelectric via hole in the piezoelectric layer 100.

In some embodiments, a passivation layer 125 is further provided on a side of the second electrode layer 120 away from the piezoelectric layer 100, and a passivation opening is provided in the passivation layer 125, the passivation opening may be in spatial communication with the electrode via hole in the second electrode E2 and the above-mentioned additional piezoelectric via hole. The interconnection pad 133 may be further disposed on a side of the second electrode E2 and/or the passivation layer 125 away from the piezoelectric layer 100, and pass through the passivation opening, the electrode via hole and the additional piezoelectric via hole to be electrically connected to the additional electrode structure 112b. For example, the interconnection pad 133 includes a horizontally extending part located at a side of the passivation layer 125 away from the piezoelectric layer.

A sidewall of a portion of the second electrode E2 defining the electrode via hole may be covered by and in contact with the interconnection pad 133. In some embodiments, a surface of the second electrode E2 at a side away from the piezoelectric layer 100 is covered by the passivation layer, and may not be in contact with the interconnection pad 133. In some other embodiments, a portion of the surface of the second electrode E2 at the side away from the piezoelectric layer 100 may not be covered by the passivation layer 125, and may be covered by and in contact with the interconnection pad 133. In some examples, a portion of the interconnection pad 133 located at the side of the second electrode E2 away from the piezoelectric layer may be located in the passivation opening, and may protrude from a surface of the passivation layer 125 away from the piezoelectric layer, and may extend to cover a portion of the surface of the passivation layer 125 away from the piezoelectric layer. In some other examples, a surface of the interconnection pad 133 at the side away from the piezoelectric layer may also be substantially level with the surface of the passivation layer 125 at the side away from the piezoelectric layer in the direction parallel to the main surface of the piezoelectric layer (for example, the second direction D2).

Still referring to FIG. 1, in some embodiments, one or more conductive pads of the pad layer 130 may further include a first conductive pad 131 electrically connected with the first electrode structure 112a and a second conductive pad 132 electrically connected with the second electrode E2; the piezoelectric layer 100 may further include a piezoelectric via hole exposing a portion of a surface of the first electrode E1, and the first conductive pad 131 is disposed on the second side of the piezoelectric layer and may be filled in the piezoelectric via hole to be electrically connected with the first electrode structure 112a through the piezoelectric via hole. The second conductive pad 132 is disposed on a side of the second electrode E2 away from the piezoelectric layer 100, and is electrically connected with the second electrode E2, for example, the second conductive pad 132 may be disposed on a side of the second electrode E2 and the passivation layer 125 away from the piezoelectric layer 100, and may extend through the passivation layer 125 to be electrically connected with the second electrode E2. The first conductive pad 131 and the second conductive pad 132 can serve as test pads, for example, may be used for testing the related performance of the resonator in a manufacturing process of the resonator.

In some embodiments, the first conductive pad 131 and the interconnection pad 133 may serve as bonding pads BP of the pad layer 130; for example, the first conductive pad 131 may serve as a first bonding pad, and includes the horizontally extending part 130a and a recessed part 130b, and includes the recess 130r defined by the recessed part 130b. The protrusion part 302p of the cover bonding layer 302 located in the recess 130r of the first conductive pad 131 may be referred to as a first protrusion part, that is, the first protrusion part is located in the recess 130r of the first conductive pad 131 and surrounded by the first conductive pad 131 in the direction parallel to the main surface of the piezoelectric layer.

For example, the horizontally extending part 130a of the first conductive pad 131 is located on a surface of the piezoelectric layer 100 at the second side S2 and is in contact with the piezoelectric layer 100; the recessed part 130b of the first conductive pad 131 is located in the piezoelectric via hole of the piezoelectric layer 100, and is in contact with and electrically connected with the first electrode structure 112a.

For example, the interconnection pad 133 may serve as a second bonding pad, and includes the horizontally extending part 130a and the recessed part 130b, and includes the recess 130r defined by the recessed part 130b. The protrusion part 302p of the cover bonding layer 302 located in the recess 130r of the interconnection pad 133 may be referred to as a second protrusion part, that is, the second protrusion part is located in the recess 130r of the interconnection pad 133 and is surrounded by the interconnection pad 133 in the direction parallel to the main surface of the piezoelectric layer.

In some embodiments, the horizontally extending part 130a of the interconnection pad 133 is located on the surface of the passivation layer 125 at the side away from the piezoelectric layer 100, and the recessed part 130b is located in the passivation opening, the electrode via hole and the additional piezoelectric via hole, and is in contact with and electrically connected with the additional electrode structure 112b. In an alternative embodiment, the horizontally extending part 130a of the interconnection pad 133 may also be located on the surface of the second electrode layer 120 at the side away from the piezoelectric layer, and located in the passivation opening, and the recessed part 130b is located in the electrode via hole and the additional piezoelectric via hole.

Still referring to FIG. 1, in some embodiments, the intermediate connecting component 150 includes the interconnection pad 133 and the additional electrode structure 112b electrically connected to each other. For example, the additional electrode structure 112b is located between the interconnection pad 133 and the second conductive connector C2 in the first direction D1, and is electrically connected with the interconnection pad 133 and the second conductive connector C2, so that the second conductive connector C2 can be electrically connected with the second electrode E2 through the additional electrode structure 112b and the interconnection pad 133.

The first electrode structure 112a and the additional electrode structure 112b are arranged in a same layer, that is, the first electrode structure layer 112, and are spaced apart and electrically isolated from each other. That is to say, the first electrode structure layer 112 includes the first electrode structure 112a and the additional electrode structure 112b that are isolated from each other.

In some embodiments, the first electrode structure layer 112 at least includes a first electrode layer 110; for example, the first electrode layer 110 includes a first electrode E1 and an additional electrode AE1 which are spaced apart and electrically isolated from each other. The first electrode E1 forms at least a portion of the first electrode structure 112a, and the additional electrode AE1 forms at least a portion of the additional electrode structure 112b.

In some embodiments, the first electrode structure layer further includes one or more edge protruding layer located at a side of the first electrode layer away from the piezoelectric layer and/or close to the piezoelectric layer, the edge protruding layer may include a first electrode edge protruding part, and the first electrode edge protruding part and the first electrode are stacked in the first direction and electrically connected to each other; the edge protruding layer may further include an additional electrode protruding part, the additional electrode protruding part and the additional electrode are stacked in the first direction and are electrically connected to each other.

For example, the first electrode structure layer 112 further includes an edge protruding layer 111; the edge protruding layer 111 includes a conductive material and is electrically connected with the first electrode layer 110. For example, the edge protruding layer 111 is located on a side of the first electrode layer 110 away from the piezoelectric layer 100, and includes a first electrode edge protruding part P1 and an additional electrode protruding part AP1 which are spaced apart and electrically isolated from each other. For example, the first electrode edge protruding part P1 may be disposed on a side of the first electrode E1 away from the piezoelectric layer 100, and may cover a surface, at a side away from the piezoelectric layer, of an edge region of a portion of the first electrode E1 located in the first cavity RC1, and cover a surface, at a side away from the piezoelectric layer, of a portion of the first electrode E1 located outside the first cavity RC1. A surface, at the side away from the piezoelectric layer, of a central region of the portion of the first electrode E1 located in the first cavity RC1 is not covered by the first electrode edge protruding part P1.

The additional electrode protruding part AP1 may be stacked on a side of the additional electrode AE1 away from the piezoelectric layer 100. In some embodiments, the additional electrode protruding part AP1 and the additional electrode AE1 may have approximately a same size in the direction parallel to the main surface of the piezoelectric layer. For example, an orthographic projection of the additional electrode protruding part AP1 on the main surface of the piezoelectric layer 100 may be located within an orthographic projection of the additional electrode AE1 on the main surface of the piezoelectric layer 100.

In this embodiment, the first electrode E1 and the first electrode edge protruding part P1 together constitute the first electrode structure 112a; the additional electrode AE1 and the additional electrode protruding part AP1 together constitute the additional electrode structure 112b.

In some embodiments, the bulk acoustic wave resonator 500 further includes a passivation layer 113, the passivation layer 113 is located between the resonant body structure 10 and the carrier structure 20 and located between the resonant body structure 10 and the first cavity RC1, and separates the first electrode structure 112a from the first cavity RC1. For example, the passivation layer 113 may extend along a surface of the first electrode structure layer 112 and a portion of a surface of the piezoelectric layer 100 at the first side, for example, the passivation layer 113 may cover sidewalls of the first electrode edge protruding part P1 and the additional electrode protruding part AP1 of the edge protruding layer 111 and surfaces of the first electrode edge protruding part P1 and the additional electrode protruding part AP1 of the edge protruding layer 111 at the side away from the piezoelectric layer 100, a sidewall of the first electrode E1 of the first electrode layer 110 and a surface of the first electrode E1 of the first electrode layer 110 at the side away from the piezoelectric layer 100, and a sidewall of the additional electrode AE1, and the passivation layer 113 may cover a surface of the piezoelectric layer 100 at the first side that is not covered by the first electrode structure layer.

For example, the passivation layer 113 includes a first passivation opening and a second passivation opening; the first conductive connector C1 extends through the carrier structure 20 and pass through the first passivation opening to be electrically connected with the first electrode structure 112a; the second conductive connector C2 extends through the carrier structure 20 and pass through the second passivation opening to be electrically connected with the additional electrode structure 112b, and further electrically connected with the second electrode E2 through the additional electrode structure 112b and the interconnection pad 133.

Still referring to FIG. 1, in some embodiments, the carrier structure 20 includes a supporting dielectric layer 201, a cavity boundary layer 202, a carrier bonding layer 203 and a carrier substrate 205. The supporting dielectric layer 201 is disposed on a side of the first electrode structure layer 112 away from the piezoelectric layer 100. The cavity boundary layer 202 is located on a side of the supporting dielectric layer 201 and the resonant body structure 10 away from the cover structure 30, and defines a portion of a boundary of the first cavity RC1. The carrier bonding layer 203 is located on a side of the cavity boundary layer 202 away from the resonant body structure 10. The carrier substrate 205 is located on a side of the carrier bonding layer 203 away from the resonant body structure 10.

In some embodiments, the first conductive connector C1 and the second conductive connector C2 are in contact with the carrier substrate 205 and the carrier bonding layer 203, and are spaced apart from the supporting dielectric layer 201. For example, the first conductive connector C1 and the second conductive connector C2 are also spaced apart from the cavity boundary layer 202.

For example, the carrier structure 20 includes a first carrier via hole and a second carrier via hole, each of the first carrier via hole and the second carrier via hole is located in the carrier substrate 205 and the carrier bonding layer 203, and includes a substrate via hole and a bonding layer via hole which are communicated with each other; the first carrier via hole of the carrier structure 20 is in spatial communication with the first passivation opening of the passivation layer 113, so as to expose a portion of the surface of the first electrode structure 112a at the side away from the piezoelectric layer; the second carrier via hole of the carrier structure 20 is in spatial communication with the second passivation opening of the passivation layer 113, so as to expose a portion of the surface of the additional electrode structure 112b at the side away from the piezoelectric layer.

For example, the first conductive connector C1 includes a first conductive via V1 located in the first carrier via hole and the first passivation opening, and a second conductive via V2 located in the second carrier via hole and the second passivation opening. The first conductive via V1 may at least cover a surface of the first carrier via hole, and be filled in the first passivation opening, and in contact with and electrically connected to the first electrode structure 112a; the second conductive via V2 may at least cover a surface of the second carrier via hole, and be filled in the second passivation opening, and in contact with and electrically connected to the additional electrode structure 112b.

In some embodiments, the supporting dielectric layer 201 is located on a side of an edge portion of the resonant body structure 10 away from the cover structure 30; a portion of the supporting dielectric layer 201 is located between the first electrode structure layer 112 and the cavity boundary layer 202 in the first direction D1, and overlaps with the cavity boundary layer 202, the carrier bonding layer 203 and the first cavity RC1 in the direction parallel to the main surface of the piezoelectric layer (for example, the second direction D2), and the portion of the supporting dielectric layer 201 may be located on a side of the cavity boundary layer 202 away from the conductive connector in the direction parallel to the main surface of the piezoelectric layer.

For example, the supporting dielectric layer 201 includes a first dielectric part and a second dielectric part; the first dielectric part is located between the first electrode structure 112a and the cavity boundary layer 202 in the first direction D1 perpendicular to the main surface of the piezoelectric layer, and the second dielectric part is located between the additional electrode structure 112b and the cavity boundary layer 202 in the first direction D1. Moreover, the first dielectric part is located on a side of the cavity boundary layer 202 away from the carrier bonding layer 203 and the first conductive via V1 in the direction parallel to the main surface of the piezoelectric layer (for example, the second direction D2); the second dielectric part is located on a side of the cavity boundary layer 202 away from the carrier bonding layer 203 and the second conductive via V2 in the direction parallel to the main surface of the piezoelectric layer.

In some embodiments, the first electrode structure layer 112 includes a gap between the first electrode structure 112a and the additional electrode structure 112b, and an orthographic projection of the gap on the main surface of the piezoelectric layer is offset from an orthographic projection of the supporting dielectric layer 201 on the main surface of the piezoelectric layer. For example, an orthographic projection of a space between the first conductive via V1 and the second conductive via V2 in the direction parallel to the main surface of the piezoelectric layer (for example, the second direction D2) on the main surface of the piezoelectric layer 100 is offset from the orthographic projection of the supporting dielectric layer 201 on the main surface of the piezoelectric layer 100.

For example, the supporting dielectric layer 201 is located on an edge portion of the first electrode structure layer 112 and includes an opening region, at least a portion of the opening region is located between the first dielectric part and the second dielectric part of the supporting dielectric layer 201; portions of the cavity boundary layer 202 and the carrier bonding layer 203 are located in the opening region, and at least portions of the first carrier via hole and second carrier via hole of the carrier structure 20 close to the first electrode structure layer are located in the opening region. For example, orthographic projections of the at least portions of the first carrier via hole and second carrier via hole close to the first electrode structure layer on the main surface of the piezoelectric layer is located within an orthographic projection of the opening region on the main surface of the piezoelectric layer; alternatively, orthographic projections of the first carrier via hole and the second carrier via hole on the main surface of the piezoelectric layer may entirely be located within the orthographic projection of the opening region on the main surface of the piezoelectric layer. For example, orthographic projections of portions of the first conductive via V1 and the second conductive via V2 that contact the first electrode structure layer 112 on the main surface of the piezoelectric layer are located within the orthographic projection of the opening region on the main surface of the piezoelectric layer, that is to say, the orthographic projections of the portions of the first conductive via V1 and the second conductive via V2 that contact the first electrode structure layer 112 on the main surface of the piezoelectric layer are offset from the orthographic projection of the supporting dielectric layer 201 on the main surface of the piezoelectric layer; alternatively, orthographic projections of the first conductive via V1 and the second conductive via V2 on the main surface of the piezoelectric layer may entirely be located within the orthographic projection of the opening region on the main surface of the piezoelectric layer. The supporting dielectric layer 201 may not include a portion located at a side of the first conductive via V1 and the second conductive via V2 close to the first cavity RC1. In some embodiments, the orthographic projection of the supporting dielectric layer 201 on the main surface of the piezoelectric layer 100 may be offset from the orthographic projection of the second cavity RC2 on the main surface of the piezoelectric layer 100.

In some embodiments, the first conductive via V1 and the second conductive via V2 are embedded in the carrier substrate 205 and the carrier bonding layer 203, and are spaced apart from the cavity boundary layer 202 and the supporting dielectric layer 201. For example, a portion of the cavity boundary layer 202 and a portion of the carrier bonding layer 203 are located between the first conductive connector C1 (for example, the first conductive via V1 of the first conductive connector C1) and the supporting dielectric layer 201, and between the second conductive connector C2 (for example, the second conductive via V2 of the second conductive connector C2) and the supporting dielectric layer 201 in the direction parallel to the main surface of the piezoelectric layer (for example, the second direction D2).

In some embodiments, the cavity boundary layer 202 includes a first boundary layer opening and a second boundary layer opening, and the carrier bonding layer includes a first bonding layer via hole (i.e., a portion of the first carrier via hole) and a second bonding layer via hole (i.e., a portion of the second carrier via hole); a portion of the first bonding layer via hole is located in the first boundary layer opening, and a portion of the second bonding layer via hole is located in the second boundary layer opening. For example, an orthographic projection of a portion of the first bonding layer via hole closest to the resonant body structure 10 (i.e., a top portion illustrated in the figure) on the piezoelectric layer 100 is located in the orthographic projection of the first boundary layer opening (e.g., a portion of the first boundary layer opening closest to the resonant body structure 10) on the piezoelectric layer; similarly, an orthographic projection of a portion of the second bonding layer via hole closest to the resonant body structure 10 on the piezoelectric layer 100 is located within the orthographic projection of the second boundary layer opening (for example, a portion of the second boundary layer opening closest to the resonant body structure) on the piezoelectric layer.

For example, the carrier bonding layer 203 includes a first filling part filled in the first boundary layer opening and a second filling part filled in the second boundary layer opening, and a portion of the first bonding layer via hole is located in the first filling part, and a portion of the second bonding layer via hole is located in the second filling part.

For example, at least a portion of the first filling part may be located between the first conductive connector C1 (for example, the first conductive via V1 of the first conductive connector C1) and the cavity boundary layer 202, and separate the first conductive connector C1 from the cavity boundary layer 202; at least a portion of the second filling part is located between the second conductive connector C2 (for example, the second conductive via V2 of the second conductive connector C2) and the cavity boundary layer 202, and separates the second conductive connector C2 from the cavity boundary layer 202.

In some embodiments, through the above arrangement of the respective material layers in the carrier structure 20, a number of material layers that the carrier via hole extends through can be reduced, thus simplifying a formation process of the carrier via hole and reducing the process difficulty of forming the carrier via hole; that is to say, the number of material layers that the conductive connector needs to extend through can be reduced, and the types of contact interfaces between the conductive connector and different material layers in the carrier structure can be reduced; this arrangement can improve the structural strength of the carrier structure and the resonator device, thus improving the reliability and device performance of the resonator.

Still referring to FIG. 1, in some embodiments, the first conductive connector C1 includes a first redistribution layer 207a and a first conductive bump 210a, and the first conductive bump 210a is electrically connected to the first electrode structure 112a through the first redistribution layer 207a; the second conductive connector C2 includes a second redistribution layer 207b and a second conductive bump 210b, and the second conductive bump 210b is electrically connected to the additional electrode structure 112b through the second redistribution layer 207b.

For example, the redistribution layer may include a via part (i.e., a conductive via) located in the carrier via hole of the carrier structure and a conductive line part located at a side of the carrier structure away from the piezoelectric layer; the via part and the conductive line part are connected to each other. For example, the first redistribution layer 207a includes the first conductive via V1 and a first conductive line L1 connected to each other; the second redistribution layer 207b includes the second conductive via V2 and the second conductive line L2 connected to each other. The first conductive via V1 and the second conductive via V2 are filled in the first carrier via hole and the second carrier via hole of the carrier structure respectively, and the first conductive line L1 and the second conductive line L2 are located on a side of the carrier structure 10 (for example, the carrier substrate 205) away from the piezoelectric layer 100. The first conductive bump 210a is disposed on the first redistribution layer 207a, for example, on a side of the first conductive line L1 away from the piezoelectric layer, and is electrically connected to the first electrode structure 112a through the first redistribution layer 207a. The second conductive bump 210b is disposed on the second redistribution layer 207b, for example, on a side of the second conductive line L2 away from the piezoelectric layer, and is electrically connected to the additional electrode structure 112b through the second redistribution layer 207b.

In some embodiments, a passivation layer 208 is further provided on the side of the redistribution layer away from the piezoelectric layer 100, and the passivation layer 208 may include a first opening and a second opening, the first opening exposes a portion of a surface of the first redistribution layer 207a, and the second opening exposes a portion of a surface of the second redistribution layer 207b, and the first conductive bump 210a and the second conductive bump 210b are electrically connected to the first redistribution layer 207a and the second redistribution layer 207b through the first opening and the second opening, respectively. That is to say, the first conductive bump 210a and second conductive bump 210b extend through the passivation layer 208 to be electrically connected to the first redistribution layer 207a and the second redistribution layer 207b, respectively. In some embodiments, the first conductive via V1 may not fill up the first carrier via hole of the carrier structure, the second conductive via V2 may not fill up the second carrier via hole of the carrier structure, and portions of the passivation layer 208 may be filled in the first carrier via hole and second carrier via hole. For example, the first conductive via V1 and the second conductive via V2 may extend along surfaces of the first carrier via hole and second carrier via hole of the carrier structure, respectively, and the passivation layer 208 includes a first part and a second part filled in the first carrier via hole and second carrier via hole, respectively. The first part of the passivation layer 208 may be surrounded by the first conductive via V1 in the direction parallel to the main surface of the carrier structure, and the second part of the passivation layer 208 may be surrounded by the second conductive via V2 in the direction parallel to the main surface of the carrier structure.

An embodiment of the present disclosure provides a manufacturing method of a bulk acoustic wave resonator, including: forming a resonant body structure, including forming a first electrode structure layer and a second electrode layer on two opposite sides of a piezoelectric layer, wherein the piezoelectric layer includes a first side and a second side opposite to each other in a first direction; the first electrode structure layer is disposed on the first side of the piezoelectric layer and includes a first electrode structure; the second electrode layer is disposed on the second side of the piezoelectric layer and includes a second electrode; forming a carrier structure on a side of the resonant body structure away from the second electrode layer, and forming a first cavity between the carrier structure and the resonant body structure, wherein a portion of the first electrode structure is located in the first cavity; bonding a cover structure on a side of the resonant body structure opposite to the carrier structure, wherein the cover structure includes a cover bonding layer and a cover substrate, the cover bonding layer is disposed between the cover substrate and the resonant body structure in the first direction, and a second cavity is disposed between the cover structure and the resonant body structure, and a portion of the second electrode layer is located in the second cavity; forming a first conductive connector and a second conductive connector on a side of the resonant body structure away from the cover structure, wherein the first conductive connector extends through the carrier structure to be electrically connected with the first electrode structure, and the second conductive connector extends through the carrier structure and is electrically connected with the second electrode through an intermediate connecting component, wherein the intermediate connecting component is spaced apart from the first cavity; and before bonding the cover structure, forming a pad layer including one or more bonding pads on a side of the resonant body structure away from the carrier structure, wherein at least a portion of each bonding pad is bonded with the cover bonding layer and each bonding pad includes a recess recessed toward the first electrode structure layer, and the cover bonding layer includes a protrusion part filling the recess, and the protrusion part is surrounded by the bonding pad.

In some embodiments, forming the first electrode structure layer includes forming a first electrode layer; and performing a patterning process on the first electrode layer to pattern the first electrode layer to a first electrode and an additional electrode spaced apart from each other, wherein the first electrode forms at least a portion of the first electrode structure, and the additional electrode forms at least a portion of the additional electrode structure.

In some embodiments, forming the first electrode structure layer further includes: forming an edge protruding layer on at least one of a side of the first electrode layer close to the piezoelectric layer and a side of the first electrode layer away from the piezoelectric layer; and performing a patterning process on the edge protruding layer to pattern the edge protruding layer into a first electrode edge protruding part and an additional electrode protruding part spaced apart from each other, wherein the first electrode and the first electrode edge protruding part are stacked and together constitute the first electrode structure, and the additional electrode and the additional electrode protruding part are stacked and together constitute the additional electrode structure.

In some embodiments, forming the carrier structure includes: forming a dielectric material layer on a side of the resonant body structure away from the second electrode layer, and patterning the dielectric material layer into a sacrificial dielectric layer and a supporting dielectric layer that are spaced apart from each other, and forming an opening region between the supporting dielectric layer and the sacrificial dielectric layer, wherein portions of the first electrode structure and the additional electrode structure overlap the opening region in the first direction; forming a cavity boundary layer on a side of the dielectric material layer and the resonant body structure away from the cover structure, and forming a first boundary layer opening and a second boundary layer opening in the cavity boundary layer; forming a carrier bonding layer on a side of the cavity boundary layer away from the resonant body structure, wherein the carrier bonding layer includes a first filling part filled in the first boundary layer opening and a second filling part filled in the second boundary layer opening; and bonding the carrier substrate to the carrier bonding layer.

In some embodiments, before forming the first conductive connector and the second conductive connector, further including: performing an etching process on the carrier substrate to remove a portion of the carrier substrate and a portion of the carrier bonding layer, and forming a first carrier via hole and a second carrier via hole in the carrier substrate, wherein the portion of the carrier bonding layer being removed includes at least a portion of the first filling part and at least a portion of the second filling part; wherein the first conductive connector and the second conductive connector are respectively filled into the first carrier via hole and the second carrier via hole. In some embodiments, the etching process does not remove the supporting dielectric layer and the cavity boundary layer.

In some embodiments, before forming the carrier structure, forming a passivation layer on a side of the resonant body structure away from the second electrode layer to cover surfaces of the first electrode structure and the piezoelectric layer; and performing a cavity etching process after bonding the carrier substrate, so as to remove the sacrificial dielectric layer and form a first cavity, wherein during the cavity etching process, the passivation layer protects the first electrode structure from being damaged by the cavity etching process.

FIG. 2 to FIG. 23 illustrate schematic cross-sectional views of a manufacturing method of a bulk acoustic wave resonator according to some embodiments of the present disclosure.

Figure 2:
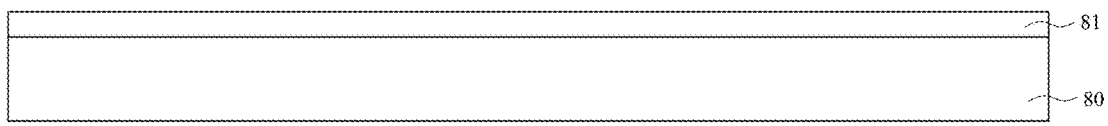
FIGS. 2 to 23 illustrate schematic cross-sectional views of a manufacturing method of a bulk acoustic wave resonator according to some embodiments of the present disclosure.

Referring to FIG. 2, a substrate 80 is provided. The substrate 80 may be a semiconductor substrate, such as a silicon substrate, but the present disclosure is not limited thereto. The substrate 80 may also adopt other suitable materials, for example, may be a glass substrate, as long as the substrate 80 can provide a structural support for the subsequently formed overlying layer(s). The substrate 80 will be removed in a subsequent process, and may also be referred to as a sacrificial substrate. In some embodiments, the substrate 80 is a wafer-level substrate.

In some embodiments, a dielectric layer 81 is formed on the substrate 80. The dielectric layer 81 may be an oxide layer, for example, may include silicon oxide ($SiO_2$). The dielectric layer 81 may be formed by a deposition process such as chemical vapor deposition or a thermal oxidation process.

Figure 3:
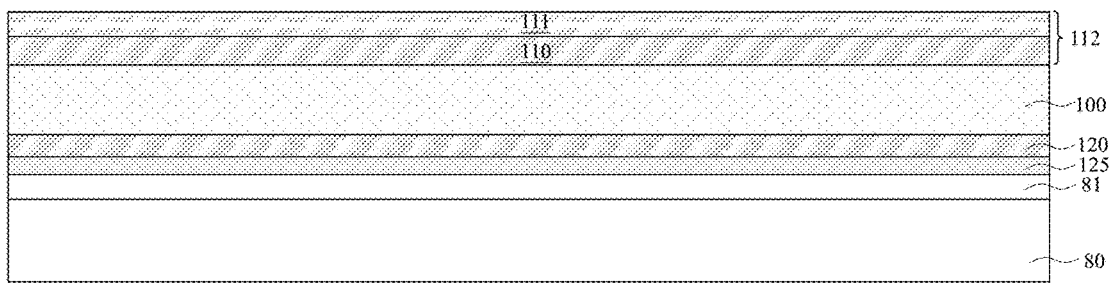

Referring to FIG. 3, a passivation layer 125, a second electrode layer 120, a piezoelectric layer 100 and a first electrode structure layer 112 are sequentially formed on the dielectric layer 81. The passivation layer 125 may include an insulating material such as aluminum nitride, silicon nitride, the like or combinations thereof. For example, the above-mentioned material layer may be formed by a suitable deposition process such as a chemical vapor deposition process and a physical vapor deposition process. The first electrode structure layer 112 may at least include the first electrode layer 110. The first electrode structure layer 112 and the second electrode layer 120 may each include a suitable electrode material, for example, include a metallic material, such as molybdenum (Mo), aluminum (Al), copper (Cu), platinum (Pt), tantalum (Ta), tungsten (W), palladium (Pd), ruthenium (Ru), the like, alloys thereof or combinations thereof. The piezoelectric layer 100 may include a suitable piezoelectric material, such as aluminum nitride (AlN), scandium-doped aluminum nitride (ScAlN), zinc oxide, lithium niobate, lithium tantalate and other materials with piezoelectric properties. It should be understood that the above materials are only for illustration, and the present disclosure is not limited thereto.

In some embodiments, forming the first electrode structure layer 112 may further include forming one or more edge protruding layers, which may be formed on a side of the first electrode layer 110 close to the piezoelectric layer 100 and/or a side of the first electrode layer 110 away from the piezoelectric layer 100. For example, the first electrode structure layer 112 may include the first electrode layer 110 and the edge protruding layer 111, and the edge protruding layer 111 is formed on a side of the first electrode layer 110 away from the piezoelectric layer 100.

In some embodiments, the edge protruding layer (not shown) may also be formed on a side of the second electrode 120 close to the piezoelectric layer 100 and/or a side of the second electrode 120 away from the piezoelectric layer 100, and the second electrode 120 and the edge protruding layer together form a second electrode structure.

The edge protruding layer includes a conductive material, for example, include a metallic material, such as molybdenum (Mo), aluminum (Al), copper (Cu), platinum (Pt), tantalum (Ta), tungsten (W), palladium (Pd), ruthenium (Ru), the like, alloys thereof or combinations thereof, the edge protruding layer is electrically connected with the corresponding electrode layer, and may have a material the same as or different from that of the corresponding electrode layer.

Figure 4:
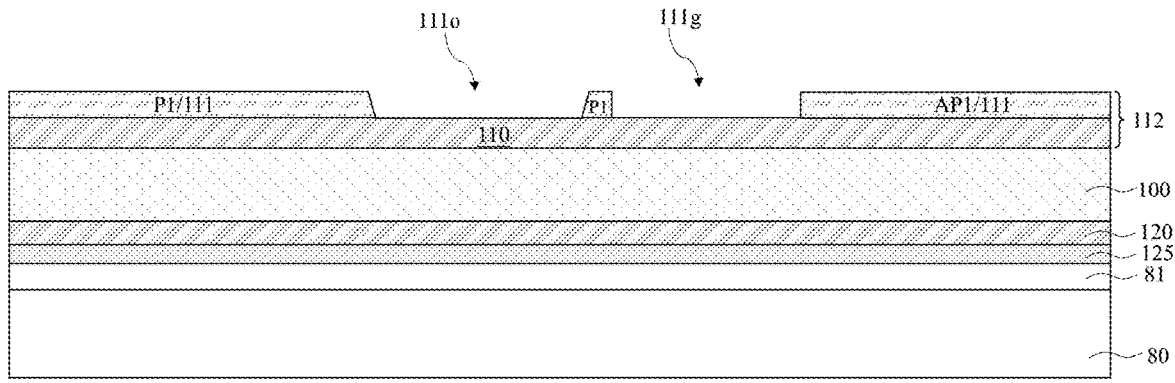

Referring to FIG. 3 and FIG. 4, a patterning process is performed on the edge protruding layer 111 to remove a portion of the edge protruding layer and form the first electrode edge protruding part P1 and the additional electrode protruding part AP1 which are spaced apart and electrically isolated from each other, and the formed first electrode edge protruding part P1 includes an opening 1110. The patterning process may include a photolithography process and an etching process. For example, the patterning process forms a gap 111g between the first electrode edge protruding part P1 and the additional electrode protruding part AP1, the gap 111g separates the first electrode edge protruding part P1 and the additional electrode protruding part AP1, and exposes a portion of the surface of the first electrode layer 110 at a side away from the piezoelectric layer 100. For example, the opening 1110 of the first electrode edge protruding part P1 also exposes a portion of the surface of the first electrode layer 110; in some embodiments, when viewed in a plan view, the first electrode edge protruding part P1 may be continuous, and the opening 1110 is located in the first electrode edge protruding part P1 without dividing the first electrode edge protruding part P1 into a plurality of portions spaced apart from each other.

Figure 5:
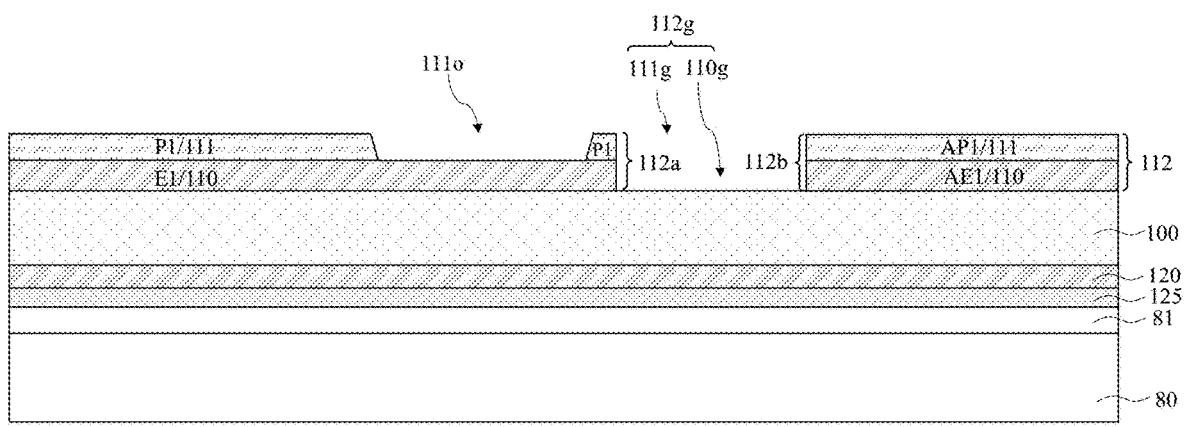

Referring to FIG. 4 and FIG. 5, a patterning process including etching is performed on the first electrode layer 110 to remove a portion of the first electrode layer 110 and form the first electrode E1 and the additional electrode AE1 which are spaced apart and electrically isolated from each other. For example, the patterning process removes a portion of the first electrode layer 110 exposed by the gap 111g of the edge protruding layer 111, and forms a gap 110g between the first electrode E1 and the additional electrode AE1, and the gap 110g separates the first electrode E1 from the additional electrode AE1 and exposes a portion of the surface of the piezoelectric layer 100 at a side away from the second electrode layer 120. For example, the gap 110g in the first electrode layer 110 is spatially communicated with the gap 111g in the edge protruding layer 111, and an orthographic projection of the gap 110g and an orthographic projection of the gap 111g on the main surface of the piezoelectric layer overlap with each other. In the patterning process, the portion of the first electrode layer exposed by the opening 1110 of the first electrode edge protruding part P1 of the edge protruding layer 111 is not removed, for example, the portion of the first electrode layer exposed by the opening 1110 may be covered by a mask so as not to be removed in the patterning process. For example, after patterning the first electrode layer 1110, the first electrode E1 and the first electrode edge protruding part P1 are stacked, and the opening 1110 of the first electrode edge protruding part P1 exposes a portion of the surface of the first electrode E1; the first electrode E1 and the first electrode edge protruding part P1 together form the first electrode structure 112a; the additional electrode AE1 and the additional electrode protruding part AP1 are stacked and together form the additional electrode structure 112b.

The gap 110g and the gap 111g together form a gap 112g of the first electrode structure layer 112 between the first electrode structure 112a and the additional electrode structure 112b. For example, the gap 112g is defined by sidewalls of the first electrode E1 and the first electrode edge protruding part P1, sidewalls of the first additional electrode AE1 and the additional electrode protruding part AP1, and a portion of the surface of the piezoelectric layer 100 away from the second electrode layer 120. For example, the sidewalls of the first electrode E1 and the first electrode edge protruding part P1 defining the gap 112g may be coplanar with each other, for example, substantially aligned in the direction perpendicular to the main surface of the piezoelectric layer; the sidewalls of the first additional electrode AE1 and the additional electrode protruding part AP1 defining the gap 112g may be coplanar with each other, for example, substantially aligned in the direction perpendicular to the main surface of the piezoelectric layer.

Figure 6:
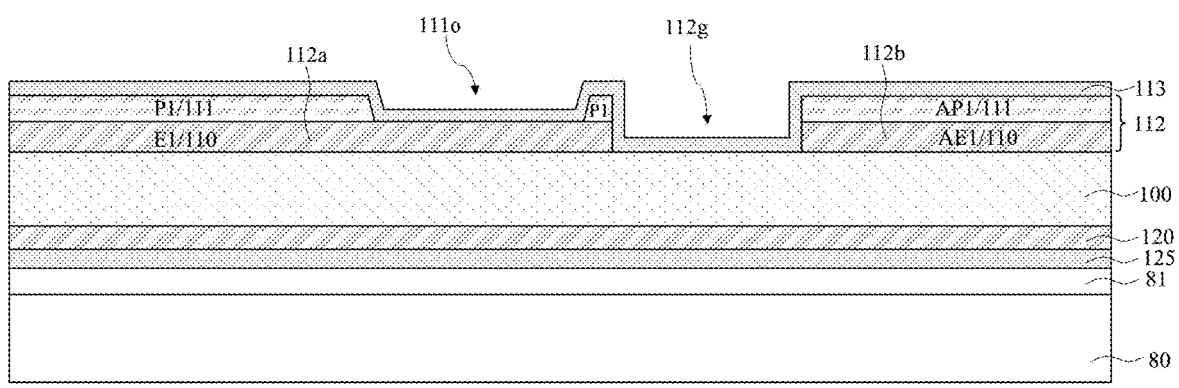

Referring to FIG. 6, a passivation layer 113 is formed on a side of the piezoelectric layer 100 and the first electrode structure layer 112 away from the second electrode layer 120. The passivation layer 113 extends along the surfaces of the first electrode structure layer 112 and the piezoelectric layer 100 and fills into the gap 112g. For example, the passivation layer 113 covers the surface of the first electrode edge protruding part P1 of the first electrode structure 112a at the side away from the piezoelectric layer, and the sidewalls of the first electrode edge protruding part P1 and the first electrode E1 defining the gap 112g, and fills in the opening 1110 of the first electrode edge protruding part P1 to cover the sidewall, defining the opening 1110, of the first electrode edge protruding part P1 and the surface of the first electrode E1 exposed by the opening 1110. The passivation layer 113 further covers the surface of the additional electrode protruding part AP1 of the additional electrode structure 112b at the side away from the piezoelectric layer 100, and the sidewalls of the additional electrode protruding part AP1 and the additional electrode AE1 defining the gap 112g. And the passivation layer 113 further covers the surface of the piezoelectric layer 100 at a side away from the second electrode layer 120 and not covered by the first electrode structure layer 112 (including the surface of the piezoelectric layer 100 exposed by the gap 112g). For example, the first electrode structure layer 112 may be completely covered by the passivation layer 113, and the orthographic projection of the first electrode structure layer 112 on the main surface of the piezoelectric layer 100 is within the orthographic projection of the passivation layer 113 on the main surface of the piezoelectric layer. A material of the passivation layer 113 may be the same as or different from the material of the passivation layer 125, and for example, the material of the passivation layer 113 may include an insulating material such as aluminum nitride, silicon nitride, the like or a combination thereof.

Figure 7:
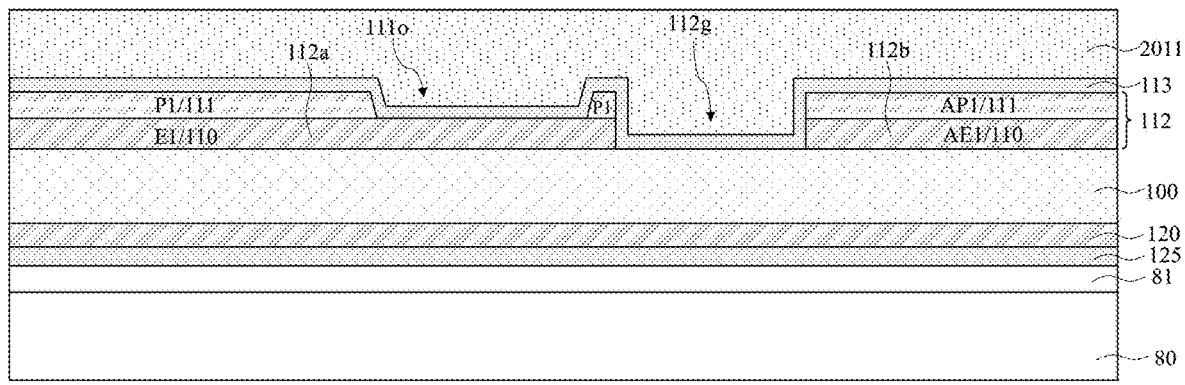
Figure 8:
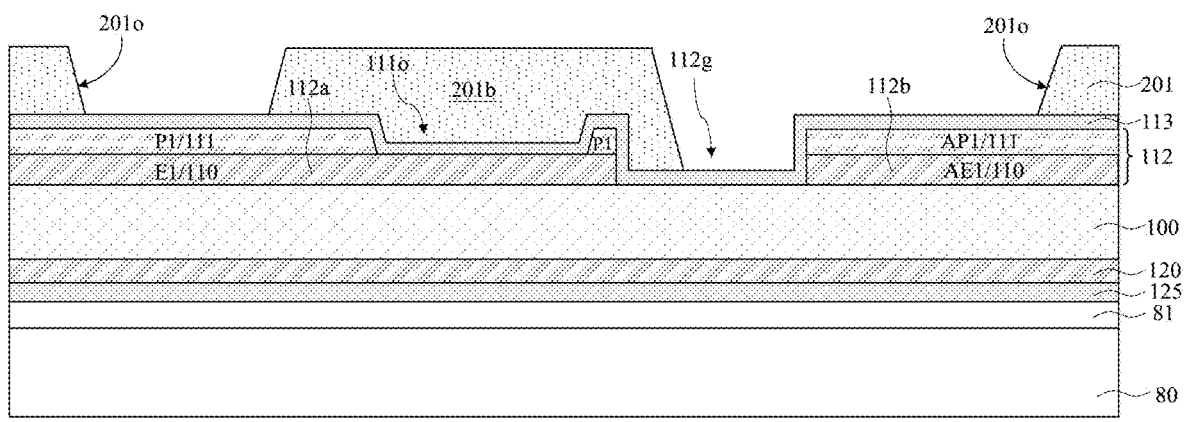

For example, referring to FIG. 7 and FIG. 8, a dielectric material layer 2011 is formed on a side of the passivation layer 113 away from the piezoelectric layer 100; a material of the dielectric material layer 2011 and the material of the passivation layer 113 are different, and have an etching selectivity ratio in the etching process. For example, the dielectric material layer 2011 may include a dielectric material such as silicon oxide. Thereafter, a patterning process is performed on the dielectric material layer 2011 to remove a portion of the dielectric material layer 2011 and form a supporting dielectric layer 201 and a sacrificial dielectric layer 201b that are spaced apart from each other. For example, the supporting dielectric layer 201 may be located above an edge portion of the piezoelectric layer 100 and may cover edge portions of the first electrode structure 112a and the additional electrode structure 112b of the first electrode structure layer 112. For example, portions of the first electrode structure 112a and the additional electrode structure 112b and a portion of the passivation layer 113 overlying thereof may not be covered by the supporting dielectric layer 201.

The sacrificial dielectric layer 201b covers portions of the first electrode structure 112a and the passivation layer 113, and may be filled in the gap 112g; for example, orthographic projections of the opening 1110 of the first electrode edge protruding part P1, a portion of the first electrode edge protruding part P1 defining the opening 1110, portions of the first electrode E1 and the passivation layer 113 corresponding to the portion of the edge protruding layer 111 on the piezoelectric layer may be within a range of an orthographic projection of the sacrificial dielectric layer 201b on the piezoelectric layer. In this embodiment, the first electrode structure 112a is covered by the passivation layer 113, and the first electrode structure 112a and the sacrificial dielectric layer 201b are spaced apart by the passivation layer 113, without contacting each other.

For example, the supporting dielectric layer 201 includes an opening region 2010 that surrounds the sacrificial dielectric layer 201b and separates the sacrificial dielectric layer 201b from the support dielectric portion 2011. For example, when viewed in a plan view, the opening region 2010 may be ring-shaped, for example, may have any type of ring shape such as a circular ring shape, a square ring shape, a polygonal ring shape or an irregular ring shape. A portion of the first electrode structure 112a, the passivation layer 113 above the portion of the first electrode structure 112a, and a portion of the additional electrode structure 112b and the passivation layer 113 above the portion of the additional electrode structure 112b are located in the opening region 2010 without being covered by the supporting dielectric layer 201 and the sacrificial dielectric layer 201b.

Figure 9:
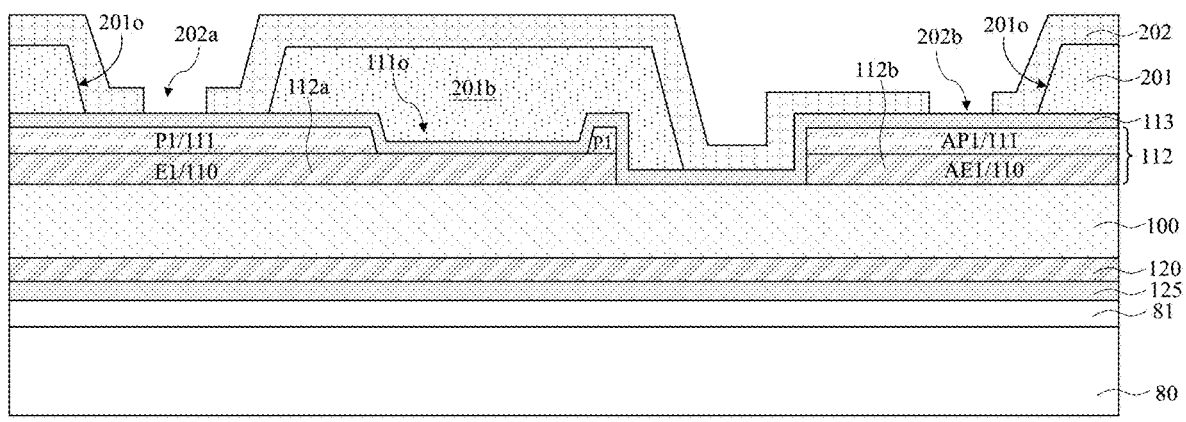

Referring to FIG. 9, a cavity boundary layer 202 is formed on a side of the piezoelectric layer 100 away from the second electrode layer 120; for example, the cavity boundary layer 202 covers a sidewall of the sacrificial dielectric layer 201b and a surface of the sacrificial dielectric layer 201b away from the piezoelectric layer, a sidewall of the supporting dielectric layer 201 and a surface of the supporting dielectric layer 201 at a side away from the piezoelectric layer, and a portion of the surface of the passivation layer 113. A material of the cavity boundary layer 202 is different from the material of the dielectric material layer 2011, that is, different from the material of the supporting dielectric layer 201 and the sacrificial dielectric layer 201b. In some embodiments, the material of the cavity boundary layer 202 may include a semiconductor material, a dielectric material, the like, or a combination thereof. For example, the cavity boundary layer 202 may include amorphous silicon, polysilicon, silicon nitride, aluminum nitride, the like, or a combination thereof, and may be formed by a suitable deposition process such as CVD, atomic layer deposition (ALD), or the like.

In some embodiments, forming the cavity boundary layer 202 further includes forming a first boundary layer opening 202a and a second boundary layer opening 200b in the cavity boundary layer 202. For example, forming the cavity boundary layer 202 may include depositing a cavity boundary material layer over the piezoelectric layer, and then etching away some portions of the cavity boundary material layer to form the cavity boundary layer 202 with the boundary layer openings described above.

In some embodiments, the first boundary layer opening 202a exposes a portion of the passivation layer 113 directly above the first electrode structure 112a, and the second boundary layer opening 202a exposes a portion of the passivation layer 113 directly above the additional electrode structure 112b. That is to say, the first boundary layer opening 202a and the second boundary layer opening 202a overlap with the first electrode structure 112a and the additional electrode structure 112b in the direction perpendicular to the main surface of the piezoelectric layer, respectively. For example, an orthographic projection of the first boundary layer opening 202a on the main surface of the piezoelectric layer is located within the orthographic projection of the first electrode structure 112a on the main surface of the piezoelectric layer; an orthographic projection of the second boundary layer opening 202b on the main surface of the piezoelectric layer is located within the orthographic projection of the additional electrode structure 112b on the main surface of the piezoelectric layer.

Figure 10:
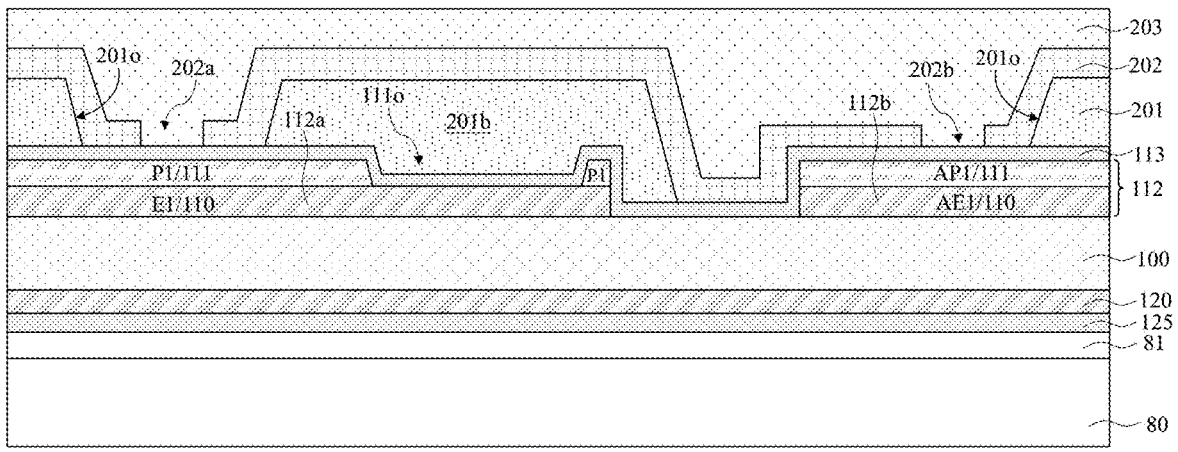

Referring to FIG. 10, a carrier bonding layer 203 is formed on a side of the cavity boundary layer 202 away from the piezoelectric layer 100, and the carrier bonding layer 203 is filled in the first boundary layer opening 202a and the second boundary layer opening 202a. For example, the carrier bonding layer 203 includes a first filling part located in the first boundary layer opening 202a and a second filling part located in the second boundary layer opening 202b.

In some embodiments, the cavity boundary layer 202 may be a conformal layer, that is to say, the cavity boundary layer 202 has a morphology conformal with that of the underlying material layer, while the carrier bonding layer 203 covers the cavity boundary layer 202 and has a substantially flat surface at the side away from the piezoelectric layer, so as to facilitate the subsequent bonding process. A material of the carrier bonding layer 203 may be different from the material of the cavity boundary layer 202. For example, the carrier bonding layer 203 may include a dielectric material such as silicon oxide ($SiO_2$). A forming method of the carrier bonding layer 203 may include depositing a bonding material layer and then performing a planarization process (for example, a chemical mechanical polishing (CMP) process) on the bonding material layer, so that the carrier bonding layer 203 has a flat surface.

Figure 11:
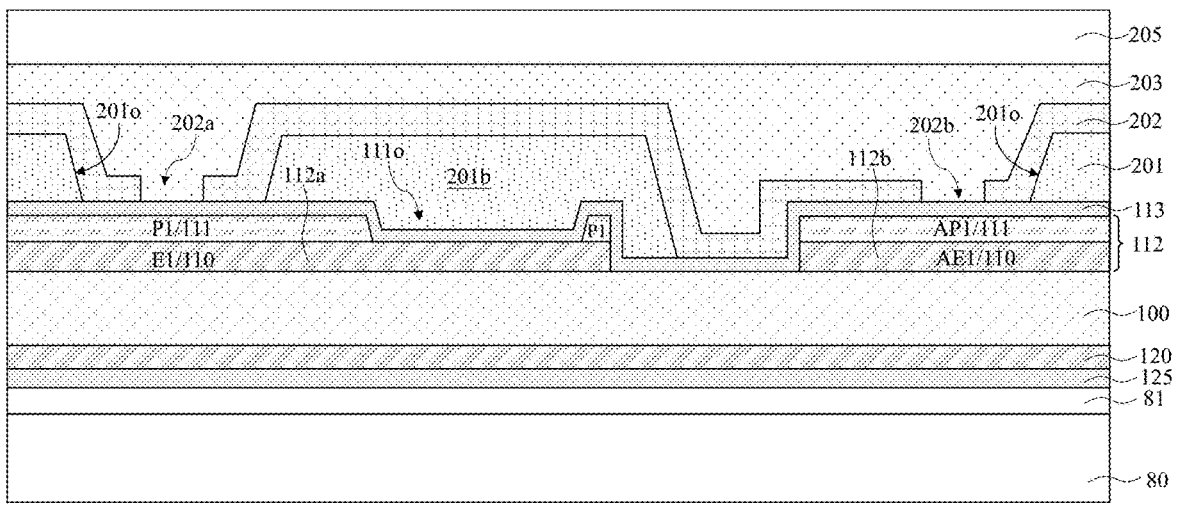

Referring to FIG. 11, a carrier substrate 205 is provided, and a bonding process is performed to bond the carrier substrate 205 and the carrier bonding layer 203 to each other. In some embodiments, the carrier substrate 205 may include a semiconductor material, a dielectric material, the like or a combination thereof. For example, the carrier substrate 205 may include silicon (Si), silicon oxide ($SiO_2$), polysilicon, silicon carbide, the like or a stacked layer including combinations thereof. In some embodiments, the carrier substrate 205 includes a semiconductor substrate (e.g., a silicon-containing substrate) and a dielectric material layer (e.g., silicon oxide) located on the semiconductor substrate, and may be bonded to the carrier bonding layer 203 through the dielectric material layer. In some embodiments, the carrier substrate 205 may be a semiconductor wafer, such as a silicon wafer.

Figure 12:
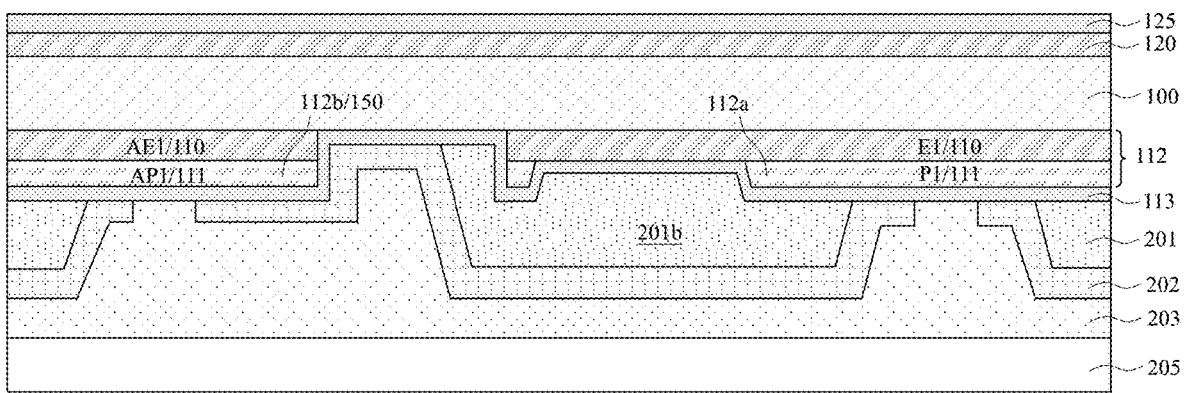
Figure 13:
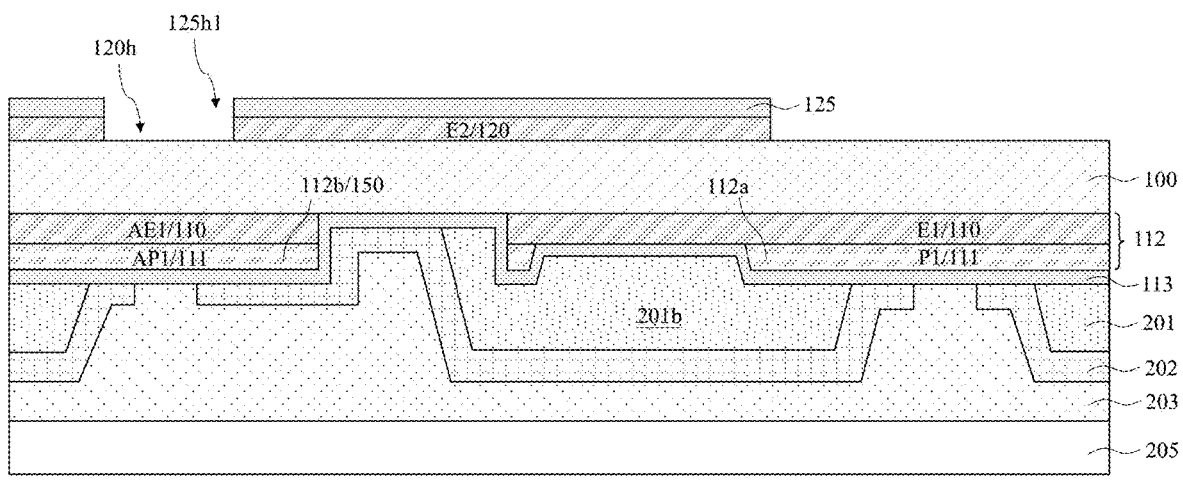

Referring to FIG. 11 and FIG. 12, the structure illustrated by FIG. 11 is turned over, and the substrate 80 and the dielectric layer 81 are removed, so as to expose a surface of the passivation layer 125 at a side away from the piezoelectric layer 100. Referring to FIG. 12 and FIG. 13, a patterning process (for example, including a photolithography process and an etching process) is performed on the passivation layer 125 and the second electrode layer 120 to remove portions of the passivation layer 125 and the second electrode layer 120, so that a second electrode E2 is formed, and the passivation layer 125 correspondingly covers a surface of the second electrode E2 at a side away from the piezoelectric layer.

In some embodiments, the patterning process includes: forming a passivation opening 125h1 in the passivation layer 125, and forming an electrode via hole 120h in the second electrode layer 120, wherein the passivation opening 125h1 and the electrode via hole 125h are in spatial communication with each other, and the electrode via hole 120h extends through the second electrode E2 and exposes a sidewall of the second electrode E2 and a portion of the surface of the piezoelectric layer 100 at a side away from the first electrode layer 110. At least portions of the electrode via hole 120h and the passivation opening 125h1 are located directly above the additional electrode structure 112b, that is to say, orthographic projections of the electrode via hole 120h and the passivation opening 125h1 on the main surface of the piezoelectric layer 100 are at least partially overlapped with an orthographic projection of the additional electrode structure 112b on the main surface of the piezoelectric layer.

Figure 14:
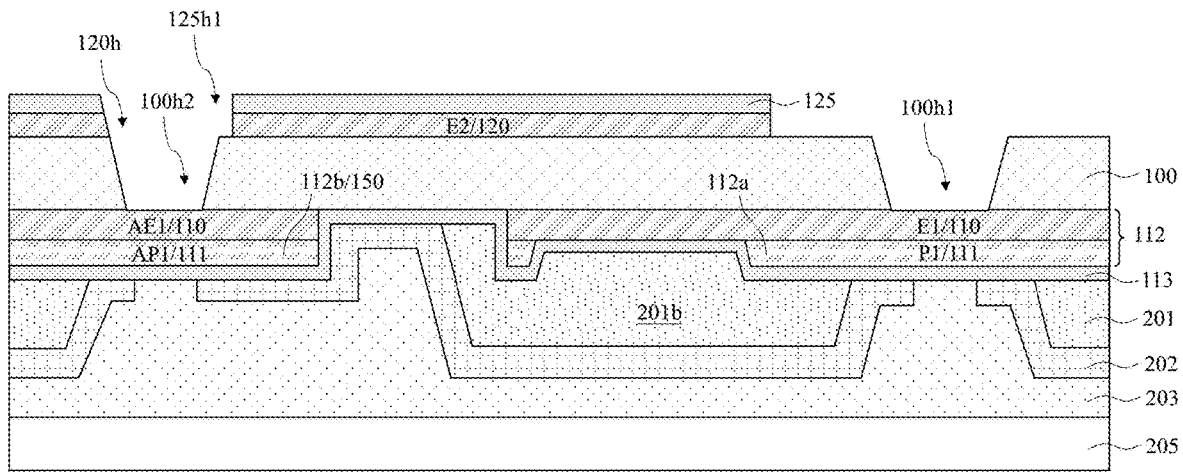

Referring to FIG. 13 and FIG. 14, an etching process is performed on the piezoelectric layer 100 to remove portions of the piezoelectric layer exposed by the second electrode layer 120 and the passivation layer 125, and to form a piezoelectric via hole 100h1 and an additional piezoelectric via hole 100h2 located in and extending through the piezoelectric layer 100. For example, the piezoelectric via hole 100h1 exposes a portion of the surface of the first electrode structure 112a at a side away from the carrier substrate 205; the additional piezoelectric via hole 100h2 is in spatial communication with the electrode via hole 120h and the passivation opening 125h1, and exposes a portion of the surface of the additional electrode structure 112b at a side away from the carrier substrate 205. In some embodiments, the etching process further forms one or more release holes (not shown) in the piezoelectric layer 100, wherein the release hole extends through the piezoelectric layer 100 to exposes a portion of the surface of the sacrificial dielectric layer 201b at a side away from the carrier substrate 205. For example, the etching process removes portions of the piezoelectric layer 100 and the passivation layer 113 located directly above the sacrificial dielectric layer 113b, thereby forming the release hole. It should be noted that the release hole only exposes a portion of the surface of the sacrificial dielectric layer 113b, and does not expose the second electrode structure layer 112, the cavity boundary layer 112, and the supporting dielectric layer 113a, etc.

In some embodiments, during the etching process on the piezoelectric layer 100, small portions of the passivation layer 125 and the second electrode layer 120 may also be removed by the etching process, and for example, sizes of the electrode via hole 120h and the passivation opening 125h1 may be increased or the shape thereof may be changed. For example, a portion of the surface of the piezoelectric layer 100 away from the first electrode structure layer may also be exposed by the electrode via hole 120h and the passivation opening 125h1.

Figure 15:
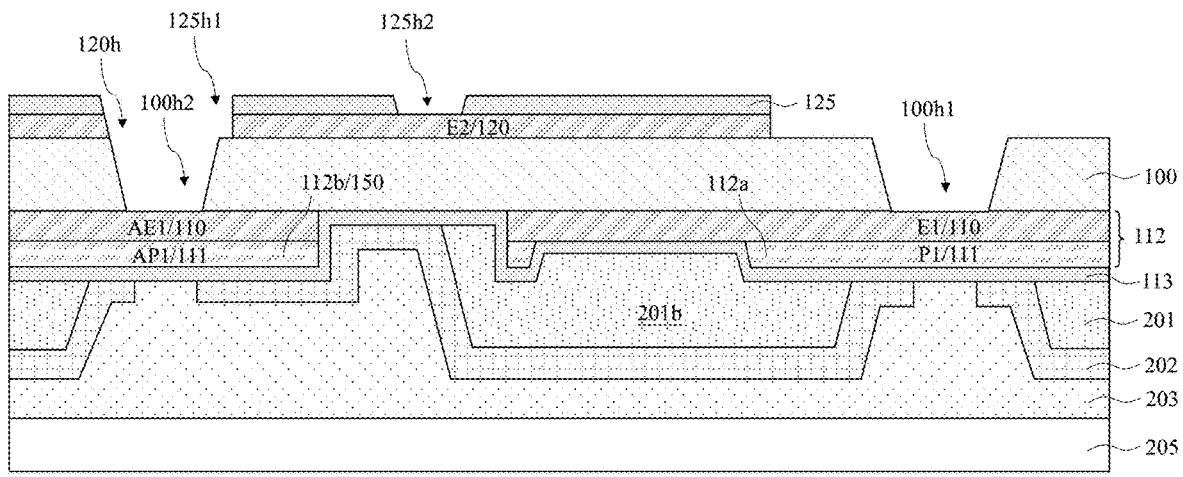

Referring to FIG. 14 and FIG. 15, in some embodiments, an etching process is further performed on the passivation layer 125 to remove a portion of the passivation layer 125 covering the second electrode E2, and form a passivation opening 125h2 in the passivation layer 125. A position of the passivation opening 125h2 is offset from a position of the electrode via hole 120h in the direction parallel to the main surface of the piezoelectric layer, that is, an orthographic projection of the passivation opening 125h2 on the piezoelectric layer is offset from an orthographic projection of the electrode via hole 120*h* on the piezoelectric layer. The passivation opening 125*h*2 extends through the passivation layer 125 and exposes a portion of the surface of the second electrode E2 at the side away from the piezoelectric layer 100. In some embodiments, the etching process may not remove the passivation layer around the passivation opening 125*h*1; in other embodiments, the etching process may further remove a portion of the passivation layer around the passivation opening 125*h*1, so that the size of the passivation opening 125*h*1 may be further increased, and a portion of the surface of the second electrode E2 at a side away from the piezoelectric layer may be exposed.

Figure 16:
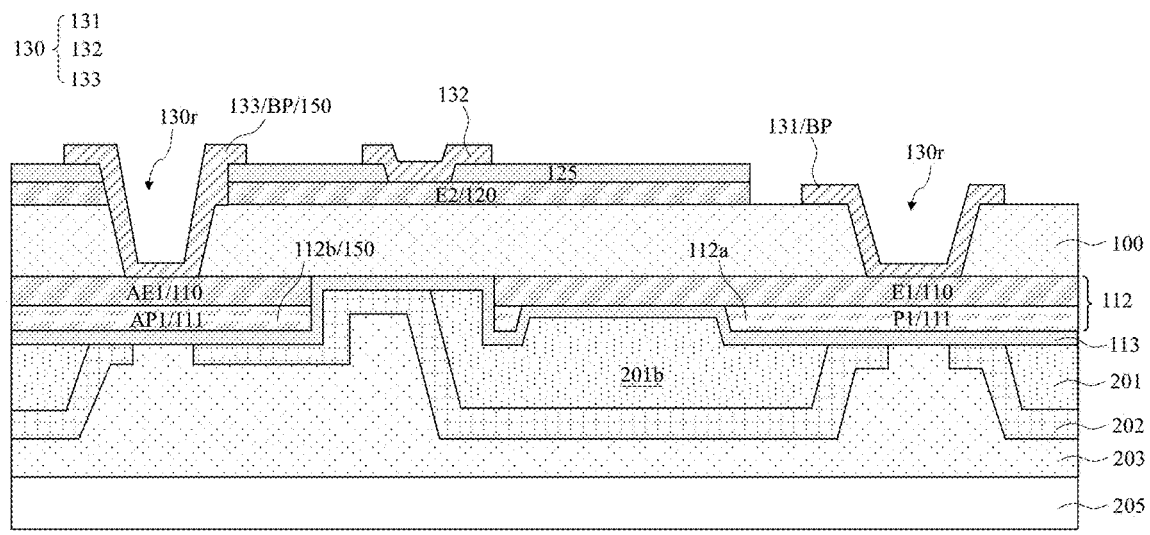

Referring to FIGS. 15 and 16, a pad layer 130 is formed on a side of the piezoelectric layer 100 away from the carrier substrate 205. The pad layer 130 includes one or more conductive pads, for example, a first conductive pad 131, a second conductive pad 132 and an interconnection pad 133 may be formed. For example, a conductive material layer may be formed by deposition on the piezoelectric layer 100, the second electrode layer 120 and the passivation layer 125, and the conductive material layer is filled in the respective piezoelectric via holes, electrode via hole and passivation opening; then, a patterning process including etching is performed on the conductive material layer, thereby forming a pad layer including the one or more conductive pads. That is to say, the first conductive pad, the interconnection pad and the second conductive pad are disposed in a same layer which is the pad layer. In present disclosure, a plurality of components being disposed in a same layer means that the plurality of components are formed from a same material layer through a same patterning process.

For example, the first conductive pad 131 is filled in the piezoelectric via hole 100*h*1 to be electrically connected with the first electrode structure 112*a*; the second conductive pad 132 is filled in the passivation opening 125*h*2 to be electrically connected with the second electrode E2; the interconnection pad 133 is filled in the passivation opening 125*h*1, the electrode via hole 120*h* and the additional piezoelectric via hole 100*h*2 to be electrically connected with the second electrode E2 and the additional electrode structure 112*b*. The interconnection pad 133 and the additional electrode structure 112*b* together constitute the intermediate connecting component 150.

In some embodiments, the first conductive pad 131 partially fills the piezoelectric via hole 100*h*1, for example, lines the surface of the piezoelectric via hole, and includes a recess 130*r*. The recess 130*r* includes, for example, a portion of the piezoelectric via hole that is not filled by the pad layer. The interconnection pad 133 is filled in the additional piezoelectric via hole and is formed with a recess; for example, the interconnection pad 133 partially fills the passivation opening, the electrode via hole and the additional piezoelectric via hole, for example, lines the surfaces of the passivation opening, the electrode via hole and the additional piezoelectric via hole, and includes recesses 130*r*, which include, for example, portions of the passivation opening, the electrode via hole and the additional piezoelectric via hole that are not filled by the pad layer.

Figure 17:
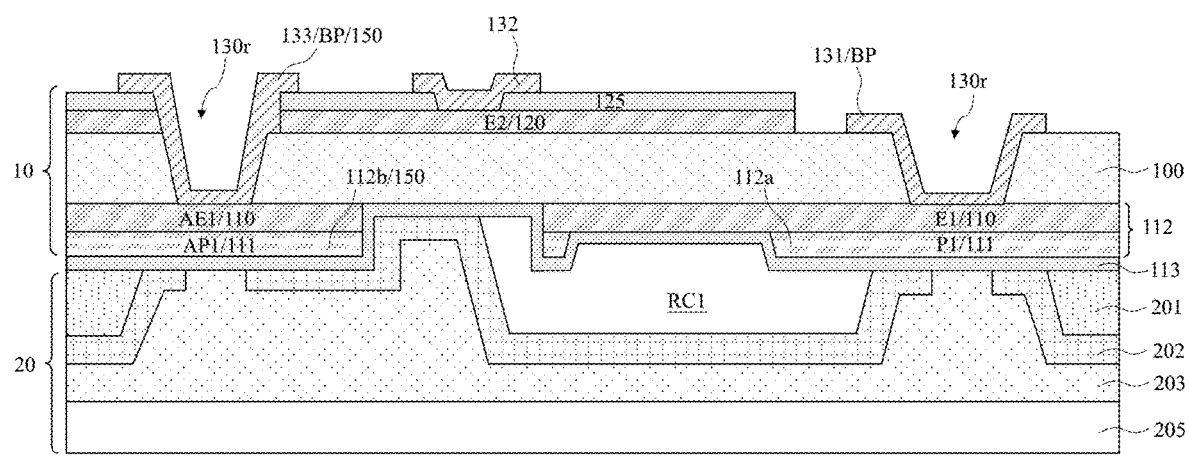

Referring to FIG. 16 and FIG. 17, the sacrificial dielectric layer 201*b* is removed to form a first cavity RC1. For example, the sacrificial dielectric layer 201*b* may be removed by an etching process, and the etching process may include: applying an etchant to a region where the sacrificial dielectric layer 201*b* is located through release hole(s) in the piezoelectric layer 100, thereby removing the sacrificial dielectric layer 201*b* and forming the first cavity RC1 at a position previously occupied by the sacrificial dielectric layer 201*b*. The etchant may include, for example, a buffer oxide etchant (BOE) or hydrofluoric acid (for example, diluted hydrofluoric acid (DHF) or the like. The buffer oxide etchant is a mixed solution of hydrofluoric acid (HF) and NH$_4$F. The etching process has a high etching selectivity of the sacrificial dielectric layer 201*b* to adjacent materials such as the cavity boundary layer 202 and the passivation layer 113, and substantially does not remove the cavity boundary layer 202 and the passivation layer 113, so that the etchant is limited in a region surrounded by the cavity boundary layer 202 and the passivation layer 113, and the first cavity RC1 is formed in this region. In addition, the cavity boundary layer 202 separates the sacrificial dielectric layer 201*b* from the carrier bonding layer 203 and the supporting dielectric layer 201, so as to protect the carrier bonding layer 203 and the supporting dielectric layer 201 from being damaged by the etching process; moreover, the passivation layer 113 separates the first electrode structure 112*a* from the sacrificial dielectric layer 201*b*, so the passivation layer 113 can protect the first electrode structure 112*a* from being damaged by the etchant during the etching process.

Referring to FIG. 17, in this way, a resonant body structure 10 and a carrier structure 20 are formed. The specific structures of the resonant body structure 10 and the carrier structure 20 are the same as those described above with reference to FIG. 1, and will not be described here again.

Figure 18:
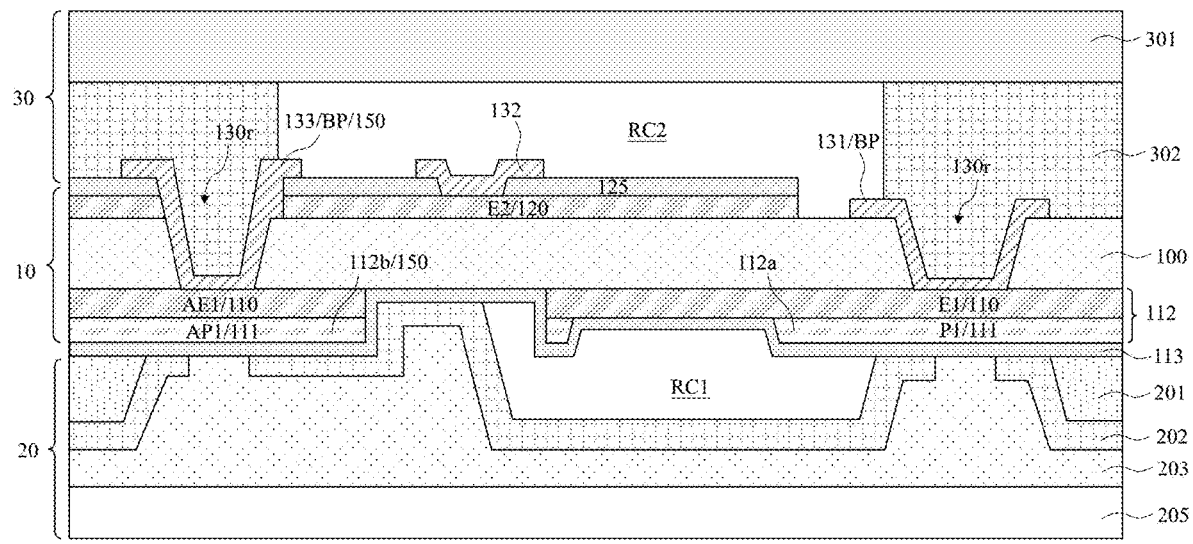

Referring to FIG. 18, a cover structure 30 is formed and bonded to a structure illustrated by FIG. 17, that is, bonded to a side of the resonant body structure 10 away from the carrier structure 20, and the cover structure 30 and the structure enclose to form a second cavity RC2. For example, forming the cover structure 30 may include providing a cover substrate 301 and forming a cover bonding layer 302 on the cover substrate 301. For example, a material of the cover substrate 301 may be the same as or different from the material of the carrier substrate 205. For example, the material of the cover substrate 301 may be or include a semiconductor material, an insulating material, a piezoelectric material, or the like, for example, include high-resistance silicon, low-resistance silicon, glass, silicon carbide, lithium niobate (LiNbO$_3$), lithium carbonate (LiTaO$_3$), or the like. For example, the cover substrate 301 may be a wafer, such as a semiconductor wafer such as a silicon wafer. The cover bonding layer 302 may include an organic material, such as a dry film, a photoresist material or the like.

In some embodiments, forming the cover bonding layer 302 on the cover substrate 301 may include: depositing and forming a bonding material layer on the cover substrate 301, and then performing a patterning process on the bonding material layer to remove a portion of the bonding material layer and to form the cover bonding layer 302. In some embodiments, because the cover bonding layer 302 is formed of dry film or photoresist material, the patterning process for forming the cover bonding layer 302 can be realized by using a photolithography process including exposure and development, and the patterning process may not require an etching process. In some embodiments, the cover bonding layer 302 may be disposed on an edge portion of the cover substrate 220 and may be ring-shaped.

Thereafter, a side of the cover substrate 301 provided with the cover bonding layer 302 is positioned to face the resonant body structure 10, and a bonding process is then performed to bond the cover structure 30 to the resonant body structure. In some embodiments, the process of bonding the cover bonding layer 302 to the underlying structure (i.e., the structure illustrated by FIG. 17) is performed after the cover bonding layer 302 is patterned, a bonding surface of the underlying structure may have an uneven morphology, therefore, using a relatively soft organic material such as a dry film or photoresist or the like for the cover bonding layer 302 can facilitate the bonding process and allow the structure formed by the bonding process to have relatively high stability and reliability.

For example, the cover bonding layer 302 may be bonded to the piezoelectric layer 100, the passivation layer 125 and the pad layer 130. In some embodiments, one or more conductive pads (e.g., the first conductive pad 131 and the interconnection pad 133) of the pad layer 130, serving as bonding pads BP, are bonded to the cover bonding layer 302. In some embodiments, the cover bonding layer 302 fills (e.g., may fill up) the recess 130r of the bonding pad BP, thereby increasing the bonding area between the cover bonding layer 302 and the underlying structure and improving the bonding strength between the cover structure and the underlying structure (i.e., the resonant body structure 10).

Referring to FIG. 17 and FIG. 18, in some embodiments, before bonding the cover structure 30 to the resonant body structure 10, the wafer structure may further be tested through the test pads. For example, the first conductive pad 131 electrically connected to the first electrode E1 and the second conductive pad 132 electrically connected to the second electrode E2 may be used for the test of the wafer structure. The test may include a wafer acceptance test (WAT), but the present disclosure is not limited thereto. In some embodiments, the test may include a test of related performances (e.g., frequency, etc.) of the resonator, and related structural parameters (e.g., thickness, etc.) of the resonator may be adjusted based on test results, so that the subsequently formed resonator can satisfy the expected requirements. In the present disclosure, the wafer structure includes a wafer and various components formed on the wafer.

Figure 19:
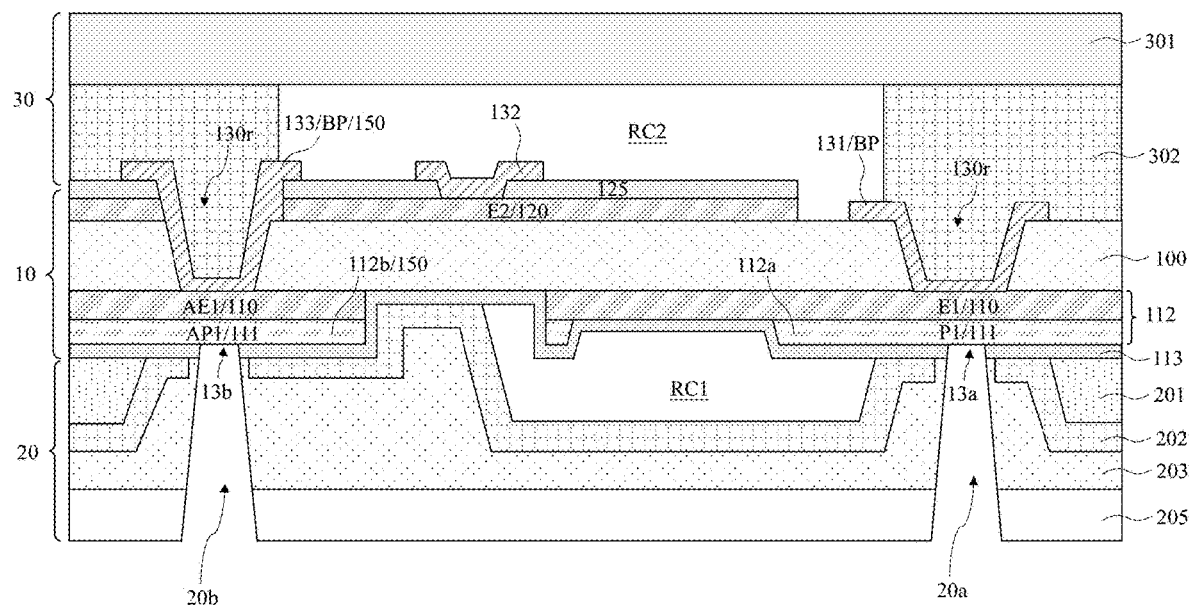

Referring to FIGS. 18 and 19, an etching process is performed on the carrier structure 20 and the passivation layer 113 to form a first carrier via hole 20a and a second carrier via hole 20b in the carrier structure 20, and a first passivation opening 13a and a second passivation opening 13b are formed in the passivation layer 113. The first carrier via hole 20a and the first passivation opening 13a are in spatial communication with each other, and expose a portion of the surface of the first electrode structure 112a at a side away from the piezoelectric layer, for example, expose a portion of the surface of the first electrode edge protruding part P1. The second carrier via hole 20b and the second passivation opening 13b are in spatial communication with each other, and expose a portion of the surface of the additional electrode structure 112b at a side away from the piezoelectric layer, for example, expose a portion of the surface of the additional electrode protruding part AP1.

For example, the etching process removes portions of the carrier substrate 205, the carrier bonding layer 203, and the passivation layer 112, thereby forming the first carrier via hole 20a and the first passivation opening 13a to expose a portion of the surface of the first electrode structure 112a at a side away from the piezoelectric layer 100, and forming the second carrier via hole 20b and the second passivation opening 13b to expose a portion of the surface of the additional electrode structure 112b at a side away from the piezoelectric layer 100. In some embodiments, at least portions of the first filling part and the second filling part of the carrier bonding layer 203 and portions of the carrier bonding layer 203, the carrier substrate 205 and the passivation layer 113 that overlap with the first filling part and the second filling part in the direction perpendicular to the main surface of the piezoelectric layer are removed in the etching process. In some embodiments, the number and/or thickness of material layers need to be removed by the etching process for forming the first carrier via hole may be approximately the same as the number and/or thickness of material layers need to be removed by the etching process for forming the second carrier via hole.

For example, the first carrier via hole 20a and the second carrier via hole 20b are located in the carrier substrate 205 and the carrier bonding layer 203, and extending through the carrier substrate 205 and the carrier bonding layer 203 and in spatial communication with the corresponding passivation openings. A portion of the first carrier via hole 20a is located in the first filling part of the carrier bonding layer 203 and is surrounded by the first boundary opening of the cavity boundary layer 202. A portion of the second carrier via hole 20b is located in the second filling part of the carrier bonding layer 203 and is surrounded by the second boundary opening of the cavity boundary layer 202. For example, in the process of forming the carrier via hole, the first filling part and the second filling part of the carrier bonding layer 203 may be partially removed, or may be completely removed, so that portions of the first carrier via hole 20a and the second carrier via hole 20b close to the passivation opening are located within the regions of the first boundary opening and the second boundary opening. In some embodiments, orthographic projections of a portion of the first carrier via hole 20a close to the first passivation opening 13a and the first passivation opening 13a on the main surface of the piezoelectric layer may be located within an orthographic projection of the first boundary layer opening of the cavity boundary layer 202 on the main surface of the piezoelectric layer; orthographic projections of a portion of the second carrier via hole 20b close to the second passivation opening 13b and the second passivation opening 13b on the main surface of the piezoelectric layer may be located within an orthographic projection of the second boundary layer opening of the cavity boundary layer 202 on the main surface of the piezoelectric layer.

In some embodiments, the above etching process of forming the first carrier via hole and the second carrier via hole may substantially not remove the cavity boundary layer 202 and the supporting dielectric layer 201. The above arrangement of the carrier structure can reduce the number of material layers required to be removed in the etching process, thereby simplifying the etching process and reducing the process difficulty of forming carrier via holes.

Figure 20:
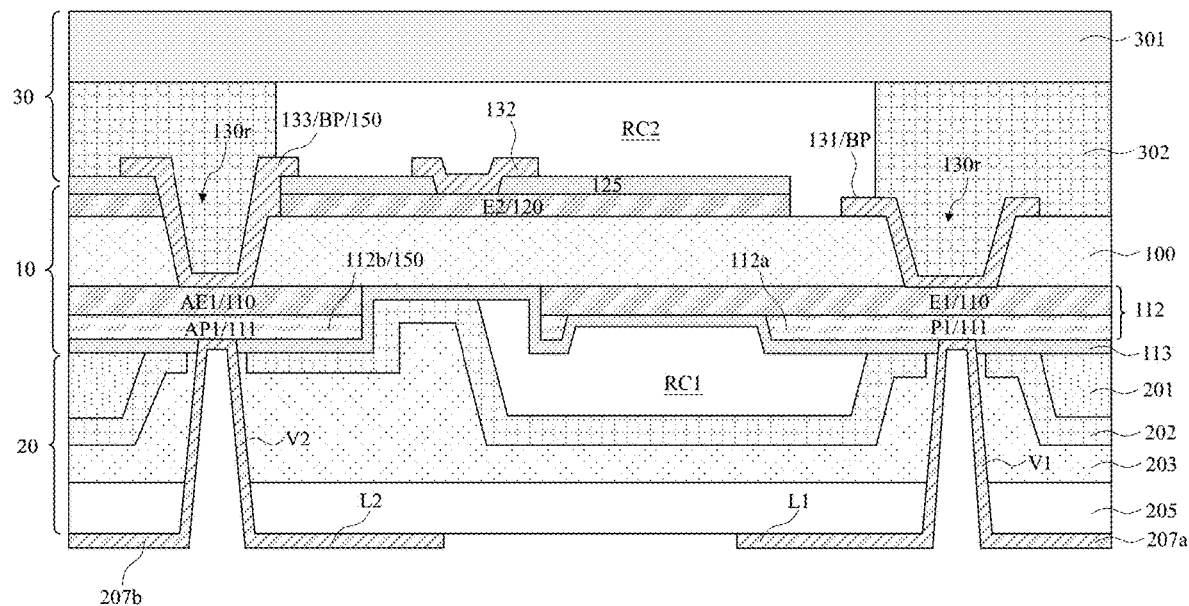

Referring to FIGS. 19 and 20, a first redistribution layer 207a and a second redistribution layer 207b are formed on the carrier structure 20, and the first redistribution layer 207a is filled in the first carrier via hole 20a and the first passivation opening 13a to contact and electrically connect with the first electrode structure 112a; the second redistribution layer 207b is filled in the second carrier via hole 20b and the second passivation opening 13b to contact and electrically connect with the additional electrode structure 112b. The first redistribution layer 207a and the second redistribution layer 207b may be formed from a same conductive material layer and may be formed in a same patterning process. For example, the first redistribution layer 207a may include a first conductive via V1 and a first conductive line L1 connected to each other; the second redistribution layer 207b may include a second conductive via V2 and a second conductive line L2 connected to each other.

Figure 21:
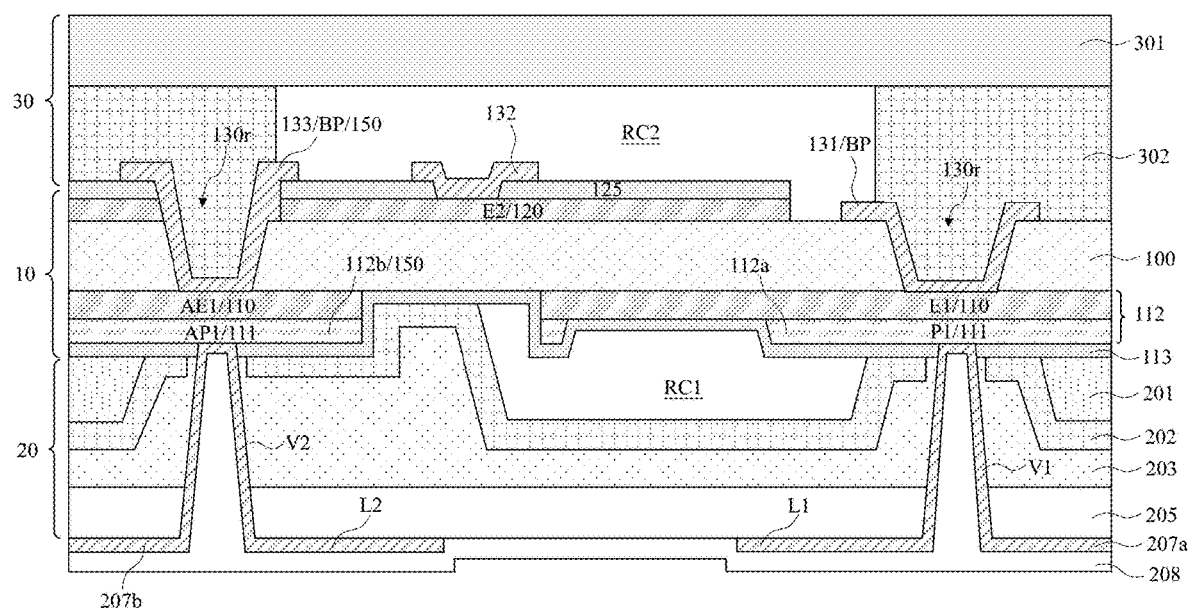

Referring to FIG. 21, a passivation layer 208 is formed on a side of the carrier structure 20, the first redistribution layer 207a and the second redistribution layer 207b away from the piezoelectric layer; in some embodiments, the redistribution layer may not completely fill the carrier via hole and/or the passivation opening, and the passivation layer 208 may fill a portion of the carrier via hole and/or the passivation opening that is not filled by the redistribution layer.

Figure 22:
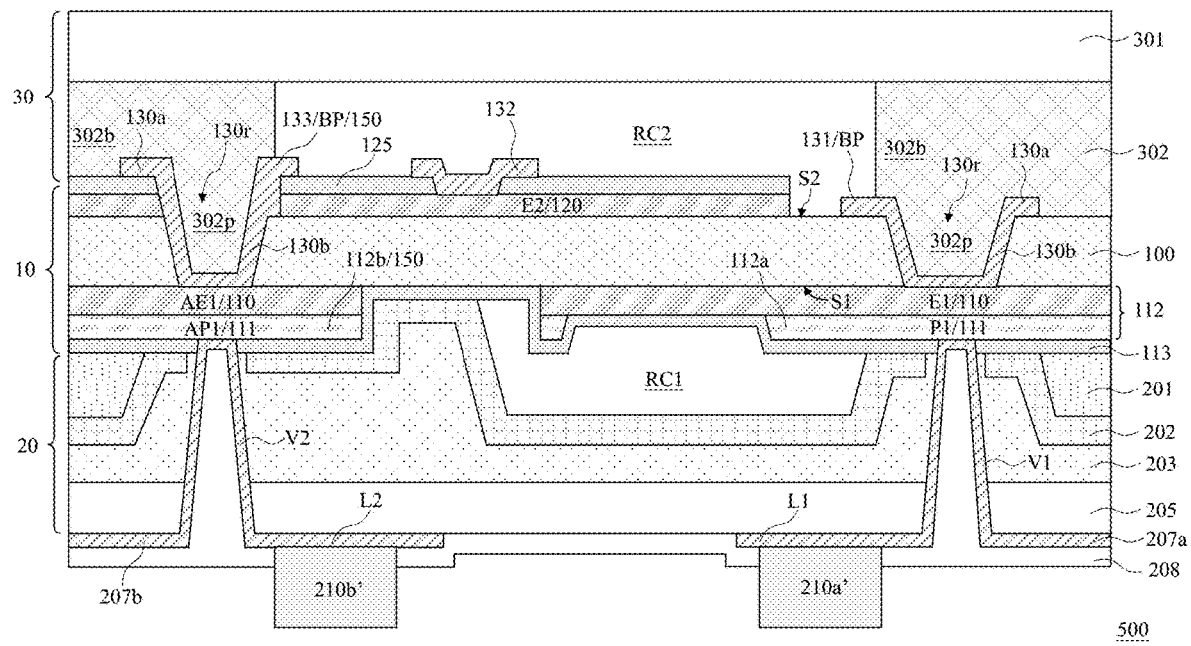
Figure 23:
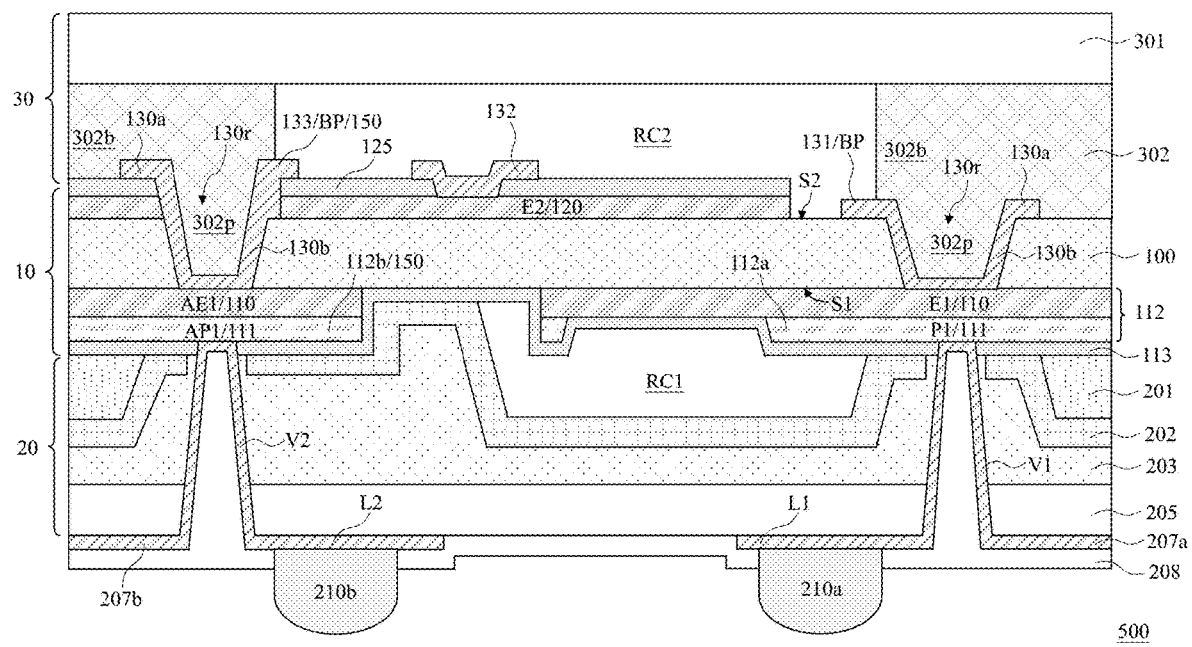

Referring to FIGS. 22 and 23, a first conductive bump 210a and a second conductive bump 210b are formed, the first conductive bump 210a is electrically connected with the first redistribution layer 207a, and the second conductive bump 210b is electrically connected with the second redistribution layer 207b. The conductive bump may be or include a solder bump. In some embodiments, forming the conductive bump may include forming a bump material and performing a reflow process on the bump material. For example, a portion of the passivation layer 208 may be etched and removed to form passivation openings in the passivation layer 208 that respectively expose the first redistribution layer and the second redistribution layer, and the bump materials are filled in the passivation openings and electrically connected with the first redistribution layer and the second redistribution layer, respectively.

For example, as illustrated by FIG. 22, a first bump material 210a' and a second bump material 210b' are formed on a side of the first redistribution layer 207a (for example, the first conductive line L1 of the first redistribution layer 207a) and the second redistribution layer 207b (for example, the second conductive line L2 of the second redistribution layer 207b) away from the piezoelectric layer, respectively; the first bump material and the second bump material may be or include solder paste, and may be formed on corresponding redistribution layers through a printing process, for example; in this step, a cross-sectional shape of the bump material may be square or the like. Thereafter, as illustrated by FIGS. 22 and 23, a reflow process is performed on the first bump material 210a' and the second bump material 210b' to form the first conductive bump 210a and the second conductive bump 210b; after the reflow process, the conductive bump may have a surface in a spherical-shape or the like; for example, the conductive bump may include a solder ball.

Referring to FIG. 23, as such, the manufacturing process of the resonator 500 is thus completed. In some embodiments, the manufacturing process of the resonator 500 adopts a wafer-level packaging process, and a package structure as formed includes a plurality of dies, and each of the dies may include one or more resonators 500. It should be understood that, FIG. 2 to FIG. 23 merely illustrate cross-sectional views of structures in a region corresponding to a single resonator in various steps in the packaging process, and other resonators located in the same die or different dies in the overall package structure are simultaneously formed by similar or substantially the same steps and may have similar or substantially the same structures as the illustrated resonator. In some embodiments, after a plurality of conductive bumps are formed, a cutting process may be performed on the formed wafer-level package structure to separate the plurality of dies from each other, so that the plurality of dies are independent of each other and each include one or more resonators 500. For example, the die may include a filter including a plurality of resonators.

The embodiments of the present disclosure provide a filter including a plurality of resonators (for example, bulk acoustic wave resonators), the plurality of resonators may be connected to each other in a series and/or parallel manner. The filter also has the technical effects described above with respect to the resonator. In some embodiments, the bulk acoustic wave resonators in the filter may each have a structure as same as or similar to the bulk acoustic wave resonator 500, and may be connected to each other through a conductive line. For example, the process step of performing the patterning process on the first electrode structure layer (for example, the first electrode layer), not only include forming the first electrodes and additional electrodes of the plurality of resonators, but also may further include forming conductive lines for connecting the first electrodes of the corresponding resonators; the process step of performing the patterning process on the second electrode layer, not only include forming the second electrodes of the plurality of resonators, but also may further include forming conductive lines for connecting the second electrodes of the corresponding resonators In some embodiments, for a plurality of resonators connected (e.g., in series) to each other in a filter, it may be unnecessary to provide conductive connectors and test pads in each of the resonators. For example, one of the plurality of resonators (e.g., a first resonator) may be selected to be provided with conductive connectors, and the first resonator may not be provided with test pads; and another one of the plurality of resonators (e.g., a second resonator) may be selected to be provided with test pads, and the second resonator may not be provided with conductive connectors, and an interconnection pad and an additional electrode structure for electrical connection of a second conductive connector and a second electrode may be provided or omitted. Because the plurality of resonators are connected in series with each other, voltages can be applied to the corresponding electrodes of the plurality of resonators through the conductive connectors in the first resonator; and the filter including the plurality of resonators can be tested through the test pads of the second resonator.

Figure 24A:
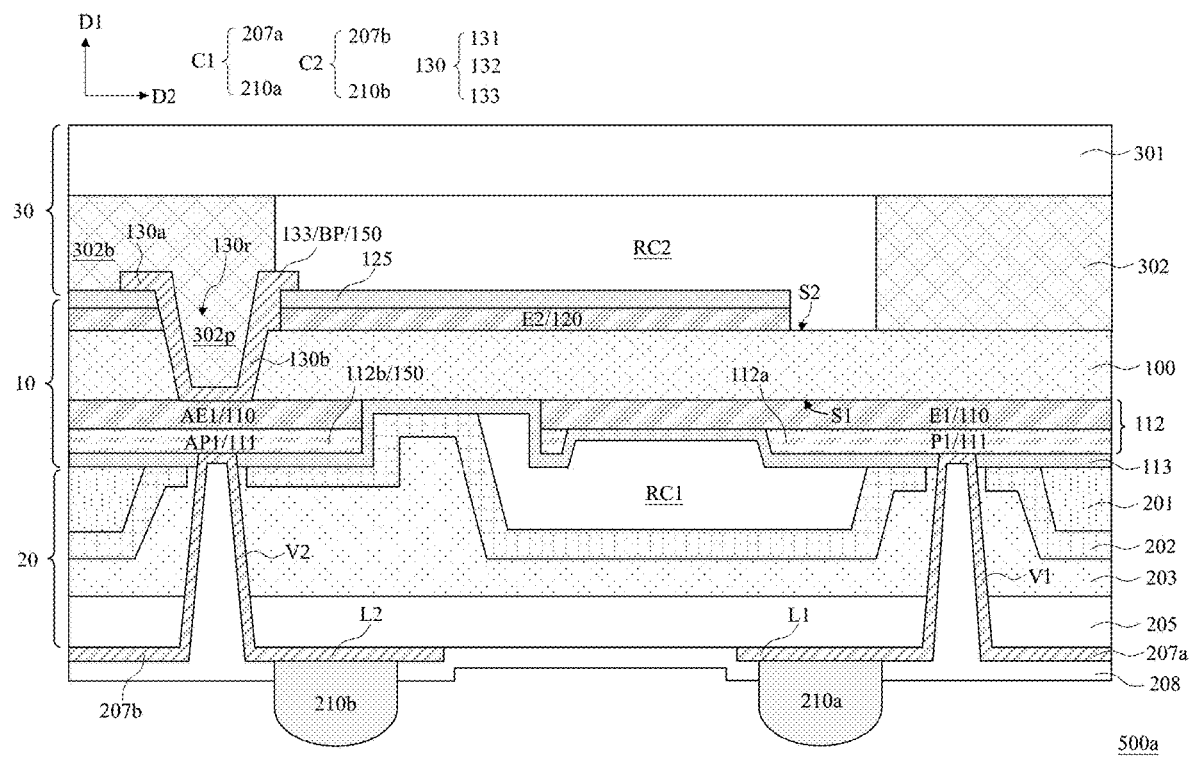
FIG. 24A illustrates a schematic cross-sectional view of a first resonator in a filter according to some embodiments of the present disclosure.
Figure 24B:
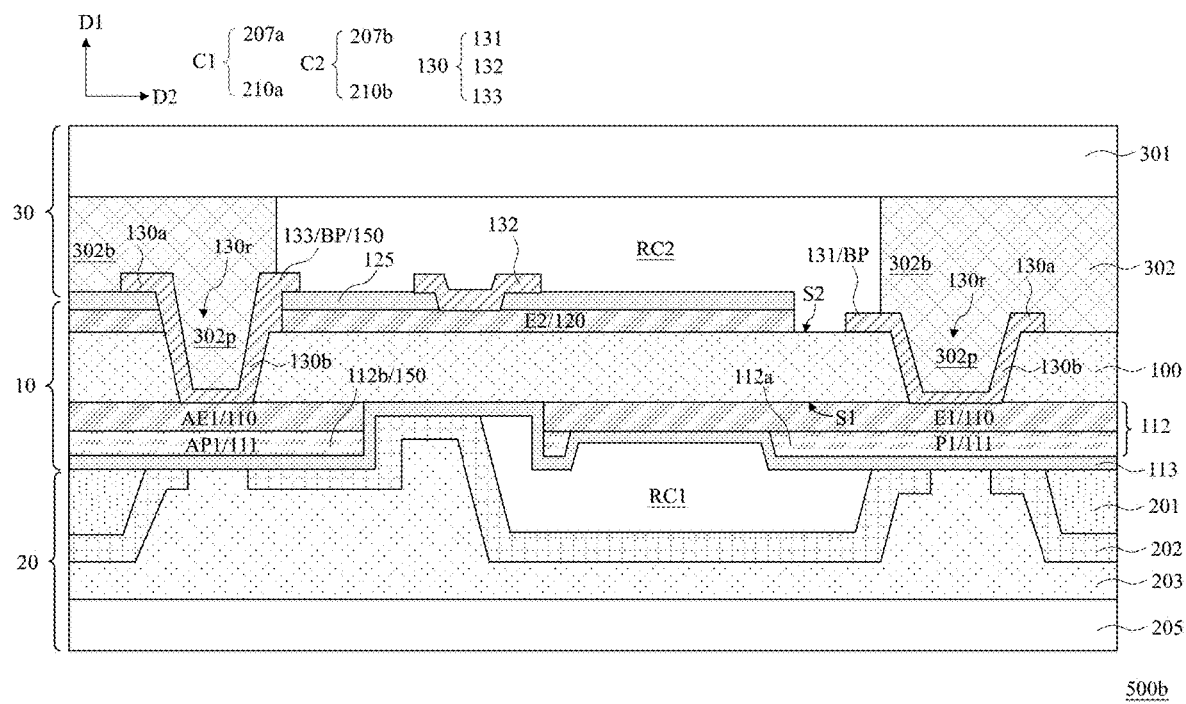
FIG. 24B illustrates a schematic cross-sectional view of a second resonator in a filter according to some embodiments of the present disclosure.

FIG. 24A and FIG. 24B schematically illustrate a first resonator 500a and a second resonator 500b included in the filter. For example, the first resonator 500a and the second resonator 500b may be connected in series with each other, and a structure of the first resonator 500a is similar to the structure of the bulk acoustic wave resonator 500 illustrated by FIG. 23, except that the first conductive pad and the second conductive pad are omitted in the first resonator 500a; alternatively, only the second conductive pad may be omitted in the first resonator 500a, and the first conductive pad may be reserved as the bonding pad. A structure of the second resonator 500b is similar to the structure of the bulk acoustic wave resonator 500 illustrated by FIG. 23, except that the first conductive connector and the second conductive connector are omitted in the second resonator 500b. In this example, the second resonator 500b may be provided with the interconnection pad 133 and the additional electrode structure 122b; in an alternative embodiment, the interconnection pad 133 and the additional electrode structure 122b may also be omitted in the second resonator 500b. In the filter, the corresponding electrodes in the first resonator 500a and the second resonator 500b may be connected to each other through conductive lines provided in the corresponding electrode layers It should be understood that, the structures of the first resonator and the second resonator illustrated by FIGS. 24A and 24B are merely for illustration; in practical application, the specific structures of the respective resonators can be appropriately adjusted based on the structure of the resonator 500 according to the product requirements, such as the connection mode of the respective resonators in the filter, and structures including these adjustments are also included in the scope of protection of the present disclosure.

Figure 25:
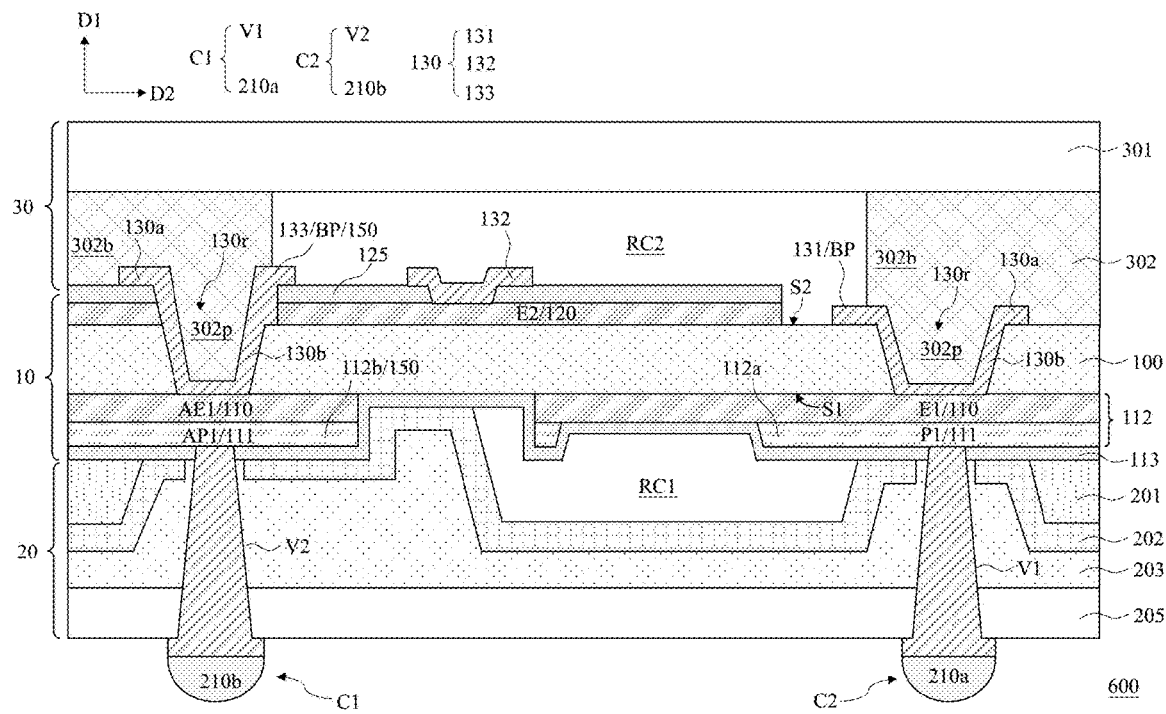
FIG. 25 illustrates a schematic cross-sectional view of a bulk acoustic wave resonator according to some other embodiments of the present disclosure.

FIG. 25 illustrates a schematic cross-sectional view of a bulk acoustic wave resonator 600 according to some other embodiments of the present disclosure. A structure of the bulk acoustic wave resonator 600 is similar to the structure of the bulk acoustic wave resonator 500, and a difference lies in that: in the bulk acoustic wave resonator 600, conductive connectors are directly connected with the corresponding electrode structures in the first electrode structure layer through conductive vias.

Referring to FIG. 25, for example, the first conductive connector C1 includes a first conductive via V1 and a first conductive bump 210a connected to each other, and the second conductive connector C2 includes a second conductive via V2 and a second conductive bump 210a connected to each other. The first conductive bump 210a is directly formed on the first conductive via V1 and overlaps with the first conductive via V1 in the first direction D1, and the second conductive bump 210b is directly formed on the second conductive via V2 and overlaps with the second conductive via V2 in the first direction D1. In this embodiment, the conductive bumps are directly electrically connected to the corresponding electrodes through the conductive vias, and the manufacturing process of the resonator can save the number of masks, thereby simplifying the process and saving the cost.

Figure 26:
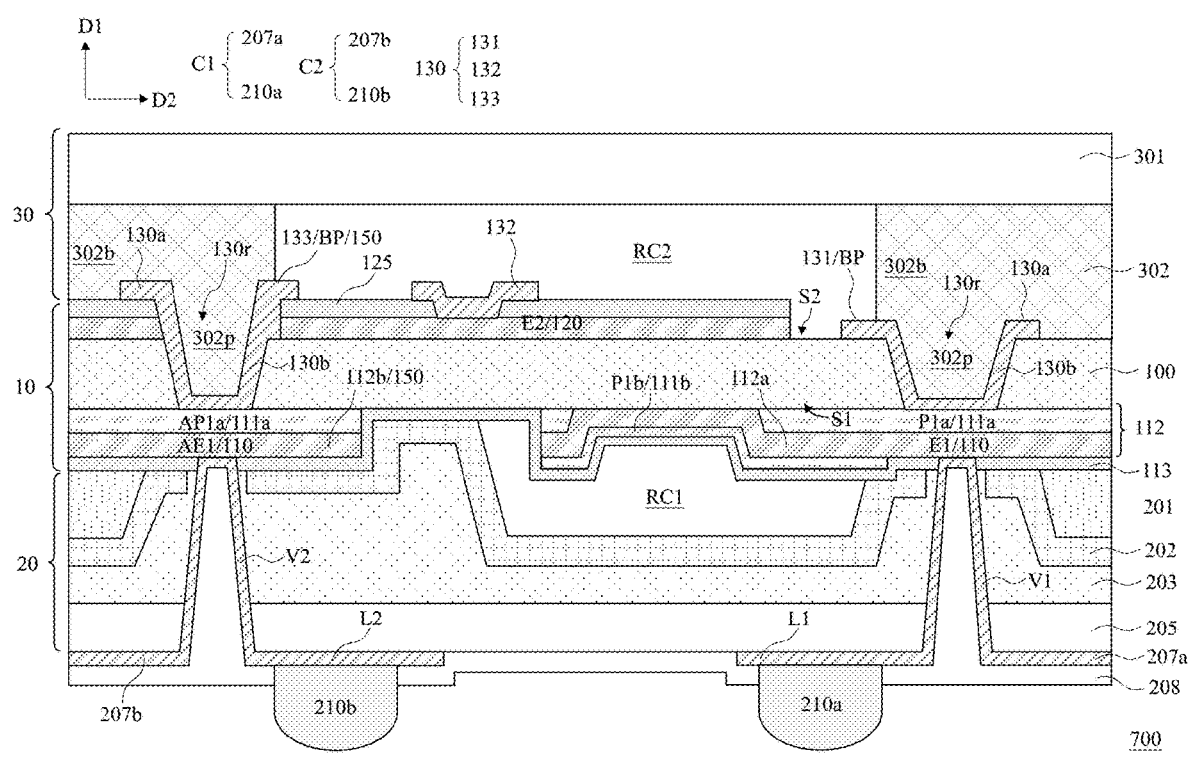
FIG. 26 illustrates a schematic cross-sectional view of a bulk acoustic wave resonator according to some other embodiments of the present disclosure.

FIG. 26 illustrates a schematic cross-sectional view of a bulk acoustic wave resonator 700 according to some other embodiments of the present disclosure. A structure of the bulk acoustic wave resonator 700 is similar to the structure of the bulk acoustic wave resonator in the above-mentioned embodiment, and a difference lies in that: in this embodiment, an edge protruding material layer may be disposed on a side of the first electrode layer close to the piezoelectric layer 100, and the first electrode structure layer may include a plurality of edge protruding material layers.

Referring to FIG. 26, for example, the first electrode structure layer 112 may include a first electrode layer 110, a first edge protruding layer 111a and a second edge protruding layer 111b; the first edge protruding layer 111a is disposed on a side of the first electrode layer 110 close to the piezoelectric layer 100, and the second edge protruding layer 111b is disposed on a side of the first electrode layer 110 away from the piezoelectric layer 100. The first electrode layer 110 includes a first electrode E1 and an additional electrode AE1 that are spaced apart and electrically isolated from each other, and each of the first edge protruding layer 111a and the second edge protruding layer 111b may include a first electrode edge protruding part and/or an additional electrode protruding part; for example, each edge protruding layer may at least include the first electrode edge protruding part stacked with the first electrode, and may or may not include the additional electrode protruding part stacked with the additional electrode.

For example, the first edge protruding layer 111a includes a first electrode edge protruding part P1a and an additional electrode protruding part AP1a that are spaced apart and electrically isolated from each other. The first electrode edge protruding part P1a is located on a side of the first electrode E1 close to the piezoelectric layer 110, and includes a protrusion opening. A portion of the first electrode E1 (for example, a central portion thereof in the first cavity RC1) is filled in the protrusion opening and contacts the piezoelectric layer 100, and other portion of the first electrode E1 and the piezoelectric layer are spaced apart from each other by the first electrode edge protruding part P1a, and thus not contact each other. The additional electrode edge protruding part AP1a is located on a side of the additional electrode AE1 close to the piezoelectric layer.

In some embodiments, the second edge protruding layer 111b may include a first electrode edge protruding part P1b located at a side of the first electrode E1 away from the piezoelectric layer. For example, the first electrode edge protruding part P1a may cover a portion of a surface of the first electrode E1 at a side away from the piezoelectric layer, for example, the first electrode edge protruding part P1a may cover a surface of a portion of the first electrode E1 located in the cavity RC1 and at a side away from the piezoelectric layer, while a surface, at a side away from the piezoelectric layer, of a portion of the first electrode E1 extending beyond the first cavity RC1 may not be covered by the first electrode edge protruding part P1b, but the present disclosure is not limited thereto. In some examples, the second edge protruding layer 111b may not include an additional electrode protruding part stacked with the additional electrode AE1. In this way, the first electrode E1, the first electrode edge protruding part P1a and the first electrode edge protruding part P1b together constitute the first electrode structure 112a. The additional electrode AE1 and the additional electrode protruding part AP1a together constitute the additional electrode structure 112b. In some other examples, the second edge protruding layer 111b may further include an additional electrode protruding part disposed on a side of the additional electrode AE1 away from the piezoelectric layer, and the additional electrode protruding part, the additional electrode AE1 and the additional electrode protruding part AP1a together constitute the additional electrode structure 112b.

Figure 27:
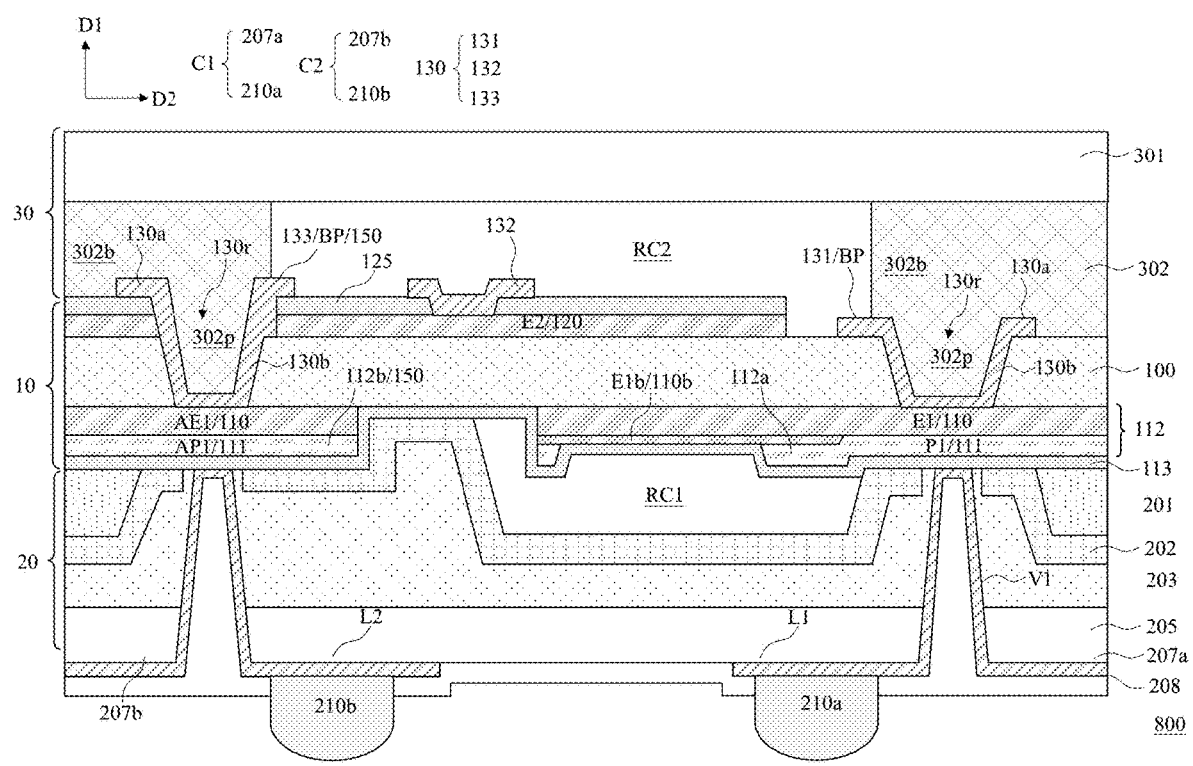
FIG. 27 illustrates a schematic cross-sectional view of a bulk acoustic wave resonator according to further embodiments of the present disclosure.

FIG. 27 illustrates a schematic cross-sectional view of a bulk acoustic wave resonator 800 according to further embodiments of the present disclosure. A structure of the bulk acoustic wave resonator 800 is similar to the structure of the bulk acoustic wave resonator in the above-mentioned embodiment, and a difference lies in that: in the bulk acoustic wave resonator 800, the first electrode structure layer may further include an electrode bump layer.

Referring to FIG. 27, for example, the first electrode structure layer 112 may further include an electrode bump layer 110b, which may be disposed on a side of the first electrode layer 110 away from the piezoelectric layer 100 and may at least include a first electrode protruding part E1b; the first electrode protruding part E1b may cover a surface, at a side away from the piezoelectric layer, of a portion of the first electrode E1 located in the first cavity, and a portion of the first electrode E1 extending beyond the first cavity may not be covered by the first electrode protruding part E1b; for example, the first electrode edge protruding part P1 is located on a side of the first electrode E1 and the first electrode protruding part E1b away from the piezoelectric layer, and the first electrode edge protruding part P1 includes an opening region to expose a portion of a surface of the first electrode protruding part E1b at a side away from the piezoelectric layer. In this example, the first electrode E1, the first electrode protruding part E1b and the first electrode edge protruding part P1 together constitute the first electrode structure 112a.

In some embodiments, the electrode bump layer 110a may not include a protruding part stacked with the additional electrode AE1, and the additional electrode AE1 and the additional electrode protruding part AP1 together constitute the additional electrode structure 112b. In some other embodiments, the electrode bump layer 110b may further include an additional protruding part stacked with the additional electrode AE1, for example, the additional protruding part is disposed between the additional electrode AE1 and the additional electrode protruding part AP1, and the additional protruding part together with the additional electrode AE1 and the additional electrode protruding part AP1 constitute the additional electrode structure 112b.

Other features such as structures of the bulk acoustic wave resonator illustrated by FIGS. 25 to 27 are similar to those of the bulk acoustic wave resonator 500 described in the previous embodiment, and have the same or similar technical effects as those of the bulk acoustic wave resonator 500, which will not be described again here.

In the embodiments of the present disclosure, through disposing the conductive connectors and the cover structure of the resonator on different sides of the piezoelectric layer, problems such as delamination, bump fracture, etc., caused by the cover bonding layer can be avoided or alleviated, and hence the device reliability of the resonator and the filter can be improved. In addition, the first and second conductive pads located on the second side of the piezoelectric layer only serve as test pads, so it is unnecessary to consider their influence on the resistance, and the thickness of these conductive pads can be disposed to be relatively small, thereby reducing the cost. Moreover, one or more conductive pads of the pad layer serve as bonding pads and are provided with a recess, and the cover bonding layer is filled into the recess of the bonding pad, so that the bonding strength of the cover structure and the resonant body structure can be improved, thereby improving the reliability and performance of the device. In addition, in some embodiments, the overall structural strength of the carrier structure and the resonator device can also be improved through the related arrangement of the carrier structure, thereby improving the reliability and performance of the device.

The following statements should be noted:

(1) The drawings of the present disclosure involve only the structure(s) in connection with the embodiment(s) of the present disclosure, and other structure(s) can be referred to common design(s).

(2) In case of no conflict, features in one embodiment or in different embodiments can be combined to obtain new embodiments.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

The invention claimed is:

1. A bulk acoustic wave resonator, comprising:
a resonant body structure, comprising a piezoelectric layer, a first electrode structure layer and a second electrode layer, wherein the piezoelectric layer has a first side and a second side opposite to each other in a first direction; the first electrode structure layer is disposed on the first side of the piezoelectric layer and comprises a first electrode structure; the second electrode layer is disposed on the second side of the piezoelectric layer and comprises a second electrode;
a carrier structure, disposed on a side of the resonant body structure away from the second electrode layer, wherein a first cavity is arranged between the carrier structure and the resonant body structure, and a portion of the first electrode structure is located in the first cavity;
a cover structure, disposed on a side of the resonant body structure opposite to the carrier structure, and comprising a cover bonding layer and a cover substrate, wherein the cover bonding layer is disposed between the cover substrate and the resonant body structure in the first direction, a second cavity is provided between the cover structure and the resonant body structure, and a portion of the second electrode layer is located in the second cavity;
a first conductive connector and a second conductive connector, disposed on a side of the resonant body structure away from the cover structure, wherein the first conductive connector extends through the carrier structure to be electrically connected with the first electrode structure, and the second conductive connector extends through the carrier structure and is electrically connected with the second electrode through an intermediate connecting component, the intermediate connecting component is spaced apart from the first cavity; and
a pad layer, located on a side of the resonant body structure away from the carrier structure, and comprising one or more bonding pads, wherein at least a portion of each of the one or more bonding pads is bonded with the cover bonding layer, and the each of the one or more bonding pads has a recess recessed toward the first electrode structure layer, and the cover bonding layer comprises a protrusion part filling the recess and surrounded by the each of the one or more bonding pads,
wherein the intermediate connecting component comprises:
an additional electrode structure, located in the first electrode structure layer, and spaced apart and electrically isolated from the first electrode structure; and
an interconnection pad, disposed in the pad layer, located on a side of the additional electrode structure away from the carrier structure, and electrically connected with the additional electrode structure and the second electrode, and serving as a second bonding pad among the one or more bonding pads,
wherein the cover bonding layer comprises a second protrusion part, located in the recess of the interconnection pad, and surrounded by the interconnection pad.

2. The bulk acoustic wave resonator according to claim 1, wherein an orthographic projection of the recess of the each of the one or more bonding pads on a main surface of the piezoelectric layer is located within an orthographic projection of the cover bonding layer on the main surface of the piezoelectric layer.

3. The bulk acoustic wave resonator according to claim 1, wherein the piezoelectric layer comprises a piezoelectric via hole, and a bonding pad of the one or more bonding pads comprises a horizontally extending part and a recessed part, the horizontally extending part is located at a side of the piezoelectric layer away from the first electrode structure layer, the recessed part is filled into the piezoelectric via hole, and defines the recess.

4. The bulk acoustic wave resonator according to claim 3, wherein an orthographic projection of the recessed part of the bonding pad on the piezoelectric layer is offset from an orthographic projection of the second cavity on the piezoelectric layer.

5. The bulk acoustic wave resonator according to claim 1, wherein the protrusion part of the cover bonding layer overlaps the piezoelectric layer in a direction parallel to a main surface of the piezoelectric layer.

6. The bulk acoustic wave resonator according to claim 1, wherein the pad layer comprises: a first conductive pad, disposed on a surface of the piezoelectric layer at the second side, and extending through the piezoelectric layer to be electrically connected with the first electrode structure;
the first conductive pad serves as a first bonding pad among the one or more bonding pads, and the cover bonding layer comprises a first protrusion part, located in the recess of the first conductive pad and surrounded by the first conductive pad.

7. The bulk acoustic wave resonator according to claim 1, wherein the first electrode structure layer at least comprises a first electrode layer, the first electrode layer comprises a first electrode and an additional electrode which are spaced apart and electrically isolated from each other, the first electrode forms at least a portion of the first electrode structure, and the additional electrode forms at least a portion of the additional electrode structure.

8. The bulk acoustic wave resonator according to claim 7, wherein the first electrode structure layer further comprises: an edge protruding layer, located on a side of the first electrode layer away from the piezoelectric layer and/or a side of the first electrode layer close to the piezoelectric layer; wherein the edge protruding layer comprises a first electrode edge protruding part and an additional electrode protruding part which are electrically isolated from each other, the first electrode edge protruding part and the first electrode are stacked in the first direction and electrically connected to each other; the additional electrode protruding part and the additional electrode are stacked in the first direction and electrically connected to each other.

9. The bulk acoustic wave resonator according to claim 1, further comprising:
a passivation layer, located between the resonant body structure and the carrier structure, and located between the resonant body structure and the first cavity, and separating the first electrode structure from the first cavity.

10. The bulk acoustic wave resonator according to claim 1, wherein the carrier structure comprises:
a supporting dielectric layer, disposed on a side of the first electrode structure layer away from the piezoelectric layer;
a cavity boundary layer, located on a side of the supporting dielectric layer and the resonant body structure away from the cover structure, and defining a portion of a boundary of the first cavity,
a carrier bonding layer, located on a side of the cavity boundary layer away from the resonant body structure, and
a carrier substrate, located on a side of the carrier bonding layer away from the resonant body structure.

11. The bulk acoustic wave resonator according to claim 10, wherein the first conductive connector and the second conductive connector are in contact with the carrier substrate and the carrier bonding layer, and are spaced apart from the supporting dielectric layer.

12. The bulk acoustic wave resonator according to claim 10, wherein the first electrode structure layer comprises a gap between the first electrode structure and an additional electrode structure of the intermediate connecting component, and an orthographic projection of the gap on a main surface of the piezoelectric layer is offset from an orthographic projection of the supporting dielectric layer on the main surface of the piezoelectric layer.

13. The bulk acoustic wave resonator according to claim 10, wherein a portion of the cavity boundary layer and a portion of the carrier bonding layer are located between the first conductive connector and the supporting dielectric layer and between the second conductive connector and the supporting dielectric layer in a direction parallel to a main surface of the piezoelectric layer.

14. The bulk acoustic wave resonator according to claim 10, wherein the cavity boundary layer comprises a first boundary layer opening and a second boundary layer opening, and the carrier bonding layer comprises a first bonding layer via hole and a second bonding layer via hole, an orthographic projection of a portion of the first bonding layer via hole closest to the resonant body structure on the piezoelectric layer is located in an orthographic projection of the first boundary layer opening on the piezoelectric layer, an orthographic projection of a portion of the second bonding layer via hole closest to the resonant body structure on the piezoelectric layer is located in an orthographic projection of the second boundary layer opening on the piezoelectric layer.

15. The bulk acoustic wave resonator according to claim 14, wherein the carrier bonding layer comprises a first filling part filled in the first boundary layer opening and a second filling part filled in the second boundary layer opening, and a portion of the first bonding layer via hole is located in the first filling part, and a portion of the second bonding layer via hole is located in the second filling part.

16. The bulk acoustic wave resonator according to claim 15, wherein a portion of the first conductive connector and a portion of the cavity boundary layer are separated by the first filling part;
a portion of the second conductive connector and a portion of the cavity boundary layer are separated by the second filling part.

17. A filter, comprising the bulk acoustic wave resonator according to claim 1.

18. A manufacturing method of a bulk acoustic wave resonator, comprising:
forming a resonant body structure, comprising forming a first electrode structure layer and a second electrode layer on two opposite sides of a piezoelectric layer, wherein the piezoelectric layer comprises a first side and a second side opposite to each other in a first direction; the first electrode structure layer is disposed on the first side of the piezoelectric layer, and comprises a first electrode structure; the second electrode layer is disposed on the second side of the piezoelectric layer, and comprises a second electrode;
forming a carrier structure on a side of the resonant body structure away from the second electrode layer, and forming a first cavity between the carrier structure and the resonant body structure, wherein a portion of the first electrode structure is located in the first cavity;
bonding a cover structure on a side of the resonant body structure opposite to the carrier structure, wherein the cover structure comprises a cover bonding layer and a cover substrate, the cover bonding layer is arranged between the cover substrate and the resonant body structure in the first direction, and a second cavity is provided between the cover structure and the resonant body structure, and a portion of the second electrode layer is located in the second cavity;
forming a first conductive connector and a second conductive connector on a side of the resonant body structure away from the cover structure, wherein the first conductive connector extends through the carrier structure to be electrically connected with the first electrode structure, and the second conductive connector extends through the carrier structure and is electrically connected with the second electrode through an intermediate connecting component, the intermediate connecting component is spaced apart from the first cavity; and before bonding the cover structure, forming a pad layer comprising one or more bonding pads on a side of the resonant body structure away from the carrier structure, wherein at least a portion of each of the one or more bonding pads is bonded with the cover bonding layer, and the each of the one or more bonding pads comprises a recess recessed toward the first electrode structure layer, and the cover bonding layer comprises a protrusion part filling the recess and surrounded by the each of the one or more bonding pads, wherein the intermediate connecting component comprises:

an additional electrode structure, located in the first electrode structure layer, and spaced apart and electrically isolated from the first electrode structure; and an interconnection pad, disposed in the pad layer, located on a side of the additional electrode structure away from the carrier structure, and electrically connected with the additional electrode structure and the second electrode, and serving as a second bonding pad among the one or more bonding pads, wherein the cover bonding layer comprises a second protrusion part, located in the recess of the interconnection pad, and surrounded by the interconnection pad.

19. The manufacturing method of the bulk acoustic wave resonator according to claim 18, wherein forming the first electrode structure layer comprises:

forming a first electrode layer; and performing a patterning process on the first electrode layer to pattern the first electrode layer into a first electrode and an additional electrode spaced apart from each other, wherein the first electrode forms at least a portion of the first electrode structure, and the additional electrode forms at least a portion of the additional electrode structure.

* * * * *